US012224733B2

United States Patent
Daimon

(10) Patent No.: US 12,224,733 B2
(45) Date of Patent: Feb. 11, 2025

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 801 days.

(21) Appl. No.: 17/492,752

(22) Filed: Oct. 4, 2021

(65) Prior Publication Data
US 2022/0029600 A1     Jan. 27, 2022

Related U.S. Application Data

(63) Continuation of application No. PCT/JP2020/015282, filed on Apr. 3, 2020.

(30) Foreign Application Priority Data

Apr. 8, 2019   (JP) ................. 2019-073691

(51) Int. Cl.
    *H03H 9/02*       (2006.01)
    *H03H 9/145*      (2006.01)
    *H03H 9/25*       (2006.01)

(52) U.S. Cl.
    CPC .... *H03H 9/02574* (2013.01); *H03H 9/02559* (2013.01); *H03H 9/02637* (2013.01);
(Continued)

(58) Field of Classification Search
CPC ...... H03H 9/25; H03H 9/145; H03H 9/02984; H03H 9/02866; H03H 9/02637; H03H 9/02559; H03H 9/02574
See application file for complete search history.

(56) References Cited

U.S. PATENT DOCUMENTS 11,271,544 B2 *   3/2022   Nakagawa ......... H03H 9/02574
2013/0285504 A1    10/2013   Tamasaki
(Continued)

FOREIGN PATENT DOCUMENTS

JP       09-331229 A     12/1997
JP       2014-207540 A   10/2014
(Continued)

OTHER PUBLICATIONS

Official Communication issued in International Patent Application No. PCT/JP2020/015282, mailed on Jun. 16, 2020.

*Primary Examiner* — Jaydi San Martin
(74) *Attorney, Agent, or Firm* — Keating & Bennett, LLP

(57) ABSTRACT

An acoustic wave device includes a silicon support substrate, a silicon nitride film on the support substrate, a silicon oxide film on the silicon nitride film, a piezoelectric layer on the silicon oxide film and using Y-cut X-SAW propagation lithium tantalate, and an IDT electrode on the piezoelectric layer. A film thickness of the piezoelectric layer is equal to or less than about $1\lambda$, Euler angles of the piezoelectric layer are $(0\pm5°, \theta, 0\pm5°)$ or $(0\pm5°, \theta, 180\pm5°)$, $\theta$ in the Euler angles of the piezoelectric layer is about $95.5°\leq\theta<117.5°$ or about $-84.5°\leq\theta<-62.5°$, and a relationship between $\theta$ in the Euler angles of the piezoelectric layer and a film thickness of the silicon nitride film is a combination shown in Table 1 or Table 2.

12 Claims, 14 Drawing Sheets

(52) U.S. Cl.
CPC .... *H03H 9/02866* (2013.01); *H03H 9/02984* (2013.01); *H03H 9/145* (2013.01); *H03H 9/25* (2013.01)

(56) References Cited

U.S. PATENT DOCUMENTS

| | | |
|---|---|---|
| 2013/0285768 A1 | 10/2013 | Watanabe et al. |
| 2014/0152146 A1 | 6/2014 | Kimura et al. |
| 2016/0285430 A1 | 9/2016 | Kikuchi et al. |
| 2016/0352305 A1 | 12/2016 | Kimura |
| 2016/0359468 A1 | 12/2016 | Taniguchi et al. |
| 2019/0356296 A1 | 11/2019 | Mimura |
| 2020/0028486 A1 | 1/2020 | Kishino et al. |
| 2020/0177153 A1 | 6/2020 | Nakagawa et al. |
| 2021/0328576 A1* | 10/2021 | Nakazawa ......... H03H 9/02574 |
| 2023/0353124 A1* | 11/2023 | Nakamura ............... H03H 9/25 |
| 2024/0048117 A1* | 2/2024 | Nakamura ......... H03H 9/02228 |
| 2024/0364290 A1* | 10/2024 | Abbott .................... H03H 3/08 |
| 2024/0380377 A1* | 11/2024 | Iwamoto ............ H03H 9/02559 |

FOREIGN PATENT DOCUMENTS

| | | |
|---|---|---|
| JP | 2015-073331 A | 4/2015 |
| JP | 2017-228841 A | 12/2017 |
| WO | 2012/086441 A1 | 6/2012 |
| WO | 2012/086639 A1 | 6/2012 |
| WO | 2012/090698 A1 | 7/2012 |
| WO | 2015/098694 A1 | 7/2015 |
| WO | 2015/137089 A1 | 9/2015 |
| WO | 2015/151706 A1 | 10/2015 |
| WO | 2018/146910 A1 | 8/2018 |
| WO | 2018/151147 A1 | 8/2018 |
| WO | 2019/031202 A1 | 2/2019 |

* cited by examiner

ACOUSTIC WAVE DEVICE

CROSS REFERENCE TO RELATED APPLICATIONS

This application claims the benefit of priority to Japanese Patent Application No. 2019-073691 filed on Apr. 8, 2019 and is a Continuation Application of PCT Application No. PCT/JP2020/015282 filed on Apr. 3, 2020. The entire contents of each application are hereby incorporated herein by reference.

BACKGROUND OF THE INVENTION

1. Field of the Invention

The present invention relates to an acoustic wave device.

2. Description of the Related Art

Existing acoustic wave devices have been widely used for, for example, a filter of a cellular phone. An example of an acoustic wave device is disclosed in International Publication No. 2012/086639. In this acoustic wave device, a support substrate, a high acoustic velocity film, a low acoustic velocity film, and a piezoelectric film are laminated in this order, and an interdigital transducer (IDT) electrode is provided on the piezoelectric film. By providing the laminated structure, the Q value is increased.

However, in the acoustic wave device described above, in the case where a plane orientation of the support substrate used is, for example, Si (111), there is a risk that a higher-order mode cannot be sufficiently reduced or prevented.

SUMMARY OF THE INVENTION

Preferred embodiments of the present invention provide acoustic wave devices that are each able to effectively reduce or prevent a higher-order mode.

An acoustic wave device according to a preferred embodiment of the present invention includes a support substrate that is a silicon substrate, a silicon nitride film on the support substrate, a silicon oxide film on the silicon nitride film, a piezoelectric layer on the silicon oxide film and including Y-cut X-SAW propagation lithium tantalate, and an IDT electrode directly or indirectly on the piezoelectric layer and including a plurality of electrode fingers, wherein, when a wavelength defined by an electrode finger pitch of the IDT electrode is $\lambda$, a film thickness of the piezoelectric layer is equal to or less than about $1\lambda$, Euler angles of the piezoelectric layer (within a range of about 0°±5°, θ, within a range of about 0°±5°) or (within a range of about 0°±5°, θ, within a range of about 180°±5°), and θ in the Euler angles of the piezoelectric layer is about 95.5°≤θ<about 117.5° or about −84.5°≤θ<about −62.5°, and a relationship between θ in the Euler angles of the piezoelectric layer and a film thickness of the silicon nitride film is a combination shown in Table 1 or Table 2 described below:

TABLE 1

| θ | FILM THICKNESS OF SiN FILM | |
|---|---|---|
| | LOWER LIMIT [λ] | UPPER LIMIT [λ] |
| 95.5 ≤ θ < 96.5 | 0.0005 | 0.746 |
| 96.5 ≤ θ < 97.5 | 0.0005 | 0.732 |

TABLE 1-continued

| θ | FILM THICKNESS OF SiN FILM | |
|---|---|---|
| | LOWER LIMIT [λ] | UPPER LIMIT [λ] |
| 97.5 ≤ θ < 98.5 | 0.0005 | 0.736 |
| 98.5 ≤ θ < 99.5 | 0.0005 | 0.726 |
| 99.5 ≤ θ < 100.5 | 0.0005 | 0.724 |
| 100.5 ≤ θ < 101.5 | 0.0005 | 0.718 |
| 101.5 ≤ θ < 102.5 | 0.0005 | 0.712 |
| 102.5 ≤ θ < 103.5 | 0.0005 | 0.71 |
| 103.5 ≤ θ < 104.5 | 0.0005 | 0.704 |
| 104.5 ≤ θ < 105.5 | 0.0005 | 0.702 |
| 105.5 ≤ θ < 106.5 | 0.0005 | 0.698 |
| 106.5 ≤ θ < 107.5 | 0.0005 | 0.695 |
| 107.5 ≤ θ < 108.5 | 0.0005 | 0.695 |
| 108.5 ≤ θ < 109.5 | 0.0005 | 0.692 |
| 109.5 ≤ θ < 110.5 | 0.0005 | 0.689 |
| 110.5 ≤ θ < 111.5 | 0.0005 | 0.689 |
| 111.5 ≤ θ < 112.5 | 0.0005 | 0.69 |
| 112.5 ≤ θ < 113.5 | 0.0005 | 0.686 |
| 113.5 ≤ θ < 114.5 | 0.0005 | 0.684 |
| 114.5 ≤ θ < 115.5 | 0.0005 | 0.684 |
| 115.5 ≤ θ < 116.5 | 0.0005 | 0.682 |
| 116.5 ≤ θ < 117.5 | 0.0005 | 0.666 |

TABLE 2

| θ | FILM THICKNESS OF SiN FILM | |
|---|---|---|
| | LOWER LIMIT [λ] | UPPER LIMIT [λ] |
| −84.5 ≤ θ < −83.5 | 0.0005 | 0.746 |
| −83.5 ≤ θ < −82.5 | 0.0005 | 0.732 |
| −82.5 ≤ θ < −81.5 | 0.0005 | 0.736 |
| −81.5 ≤ θ < −80.5 | 0.0005 | 0.726 |
| −80.5 ≤ θ < −79.5 | 0.0005 | 0.724 |
| −79.5 ≤ θ < −78.5 | 0.0005 | 0.718 |
| −78.5 ≤ θ < −77.5 | 0.0005 | 0.712 |
| −77.5 ≤ θ < −76.5 | 0.0005 | 0.71 |
| −76.5 ≤ θ < −75.5 | 0.0005 | 0.704 |
| −75.5 ≤ θ < −74.5 | 0.0005 | 0.702 |
| −74.5 ≤ θ < −73.5 | 0.0005 | 0.698 |
| −73.5 ≤ θ < −72.5 | 0.0005 | 0.695 |
| −72.5 ≤ θ < −71.5 | 0.0005 | 0.695 |
| −71.5 ≤ θ < −70.5 | 0.0005 | 0.692 |
| −70.5 ≤ θ < −69.5 | 0.0005 | 0.689 |
| −69.5 ≤ θ < −68.5 | 0.0005 | 0.689 |
| −68.5 ≤ θ < −67.5 | 0.0005 | 0.69 |
| −67.5 ≤ θ < −66.5 | 0.0005 | 0.686 |
| −66.5 ≤ θ < −65.5 | 0.0005 | 0.684 |
| −65.5 ≤ θ < −64.5 | 0.0005 | 0.684 |
| −64.5 ≤ θ < −63.5 | 0.0005 | 0.682 |
| −63.5 ≤ θ < −62.5 | 0.0005 | 0.666 |

An acoustic wave device according to a preferred embodiment of the present invention includes a support substrate that is a silicon substrate, a silicon nitride film on the support substrate, a silicon oxide film on the silicon nitride film, a piezoelectric layer on the silicon oxide film and including Y-cut X-SAW propagation lithium tantalate, and an IDT electrode on the piezoelectric layer and including a plurality of electrode fingers, wherein, when a wavelength defined by an electrode finger pitch of the IDT electrode is $\lambda$, a film thickness of the piezoelectric layer is equal to or less than about $1\lambda$, Euler angles of the piezoelectric layer (within a range of about 0°±5°, θ, within a range of about 0°±5°), and θ in the Euler angles of the piezoelectric layer is about 117.5°≤θ<about 129.5°, and a relationship between θ in the Euler angles of the piezoelectric layer and a film thickness of the silicon nitride film is a combination shown in Table 3 described below:

TABLE 3

| θ | FILM THICKNESS OF SiN FILM | |
|---|---|---|
| | LOWER LIMIT [λ] | UPPER LIMIT [λ] |
| 117.5 ≤ θ < 118.5 | 0.0005 | 0.092 |
| 117.5 ≤ θ < 118.5 | 0.166 | 0.597 |
| 118.5 ≤ θ < 119.5 | 0.0005 | 0.07 |
| 118.5 ≤ θ < 119.5 | 0.168 | 0.554 |
| 119.5 ≤ θ < 120.5 | 0.005 | 0.063 |
| 119.5 ≤ θ < 120.5 | 0.152 | 0.522 |
| 120.5 ≤ θ < 121.5 | 0.004 | 0.06 |
| 120.5 ≤ θ < 121.5 | 0.132 | 0.492 |
| 121.5 ≤ θ < 122.5 | 0.022 | 0.052 |
| 121.5 ≤ θ < 122.5 | 0.12 | 0.466 |
| 122.5 ≤ θ < 123.5 | 0.22 | 0.43 |
| 123.5 ≤ θ < 124.5 | 0.24 | 0.4 |
| 124.5 ≤ θ < 125.5 | 0.25 | 0.38 |
| 125.5 ≤ θ < 126.5 | 0.25 | 0.38 |
| 126.5 ≤ θ < 127.5 | 0.25 | 0.36 |
| 127.5 ≤ θ < 128.5 | 0.25 | 0.31 |
| 128.5 ≤ θ < 129.5 | 0.25 | 0.28 |

An acoustic wave device according to a preferred embodiment of the present invention includes a support substrate that is a silicon substrate, a silicon nitride film on the support substrate, a silicon oxide film on the silicon nitride film, a piezoelectric layer on the silicon oxide film and including Y-cut X-SAW propagation lithium tantalate, and an IDT electrode on the piezoelectric layer and including a plurality of electrode fingers, wherein, when a wavelength defined by an electrode finger pitch of the IDT electrode is λ, a film thickness of the piezoelectric layer is equal to or less than about 1λ, Euler angles of the piezoelectric layer (within a range of about 0°±5°, θ, within a range of about 0°±5°), and θ in the Euler angles of the piezoelectric layer is about 85.5°≤θ<about 95.5°, and a relationship between θ in the Euler angles of the piezoelectric layer and a film thickness of the silicon nitride film is a combination shown in Table 4 described below:

TABLE 4

| θ | FILM THICKNESS OF SiN FILM | |
|---|---|---|
| | LOWER LIMIT [λ] | UPPER LIMIT [λ] |
| 85.5 ≤ θ < 86.5 | 0.0005 | 0.03 |
| 85.5 ≤ θ < 86.5 | 0.43 | 0.46 |
| 86.5 ≤ θ < 87.5 | 0.0005 | 0.038 |
| 86.5 ≤ θ < 87.5 | 0.42 | 0.47 |
| 87.5 ≤ θ < 88.5 | 0.0005 | 0.048 |
| 87.5 ≤ θ < 88.5 | 0.412 | 0.485 |
| 88.5 ≤ θ < 89.5 | 0.0005 | 0.058 |
| 88.5 ≤ θ < 89.5 | 0.404 | 0.506 |
| 89.5 ≤ θ < 90.5 | 0.0005 | 0.07 |
| 89.5 ≤ θ < 90.5 | 0.388 | 0.52 |
| 90.5 ≤ θ < 91.5 | 0.0005 | 0.085 |
| 90.5 ≤ θ < 91.5 | 0.37 | 0.538 |
| 91.5 ≤ θ < 92.5 | 0.0005 | 0.102 |
| 91.5 ≤ θ < 92.5 | 0.346 | 0.56 |
| 92.5 ≤ θ < 93.5 | 0.0005 | 0.128 |
| 92.5 ≤ θ < 93.5 | 0.315 | 0.59 |
| 93.5 ≤ θ < 94.5 | 0.0005 | 0.166 |
| 93.5 ≤ θ < 94.5 | 0.295 | 0.616 |
| 94.5 ≤ θ < 95.5 | 0.0005 | 0.226 |
| 94.5 ≤ θ < 95.5 | 0.284 | 0.66 |

With acoustic wave devices according to preferred embodiments of the present invention, it is possible to effectively reduce or prevent a higher-order mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing preferred embodiments of the present invention with reference to the drawings.

The preferred embodiments described in the present specification are exemplary, and partial replacement or combination of components between different preferred embodiments is possible.

Figure 1:
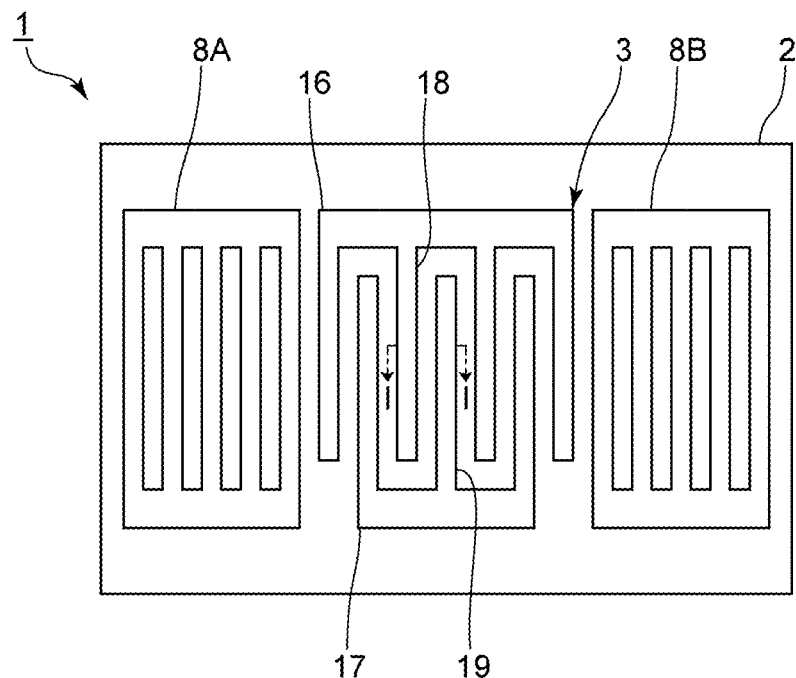
FIG. 1 is a plan view of an acoustic wave device according to a first preferred embodiment of the present invention.

FIG. 1 is a plan view of an acoustic wave device according to a first preferred embodiment of the present invention.

An acoustic wave device 1 includes a piezoelectric substrate 2. An IDT electrode 3 is provided on the piezoelectric substrate 2. An acoustic wave is excited by applying an AC voltage to the IDT electrode 3. A pair of reflectors 8A and 8B is provided on both sides of the IDT electrode 3 in an acoustic wave propagation direction on the piezoelectric substrate 2. The acoustic wave device 1 of the present preferred embodiment is an acoustic wave resonator, for example. However, the acoustic wave device 1 according to the present invention is not limited to an acoustic wave resonator, and may be, for example, a filter device including a plurality of acoustic wave resonators, a multiplexer including the filter device, or the like.

The IDT electrode 3 includes a first busbar 16 and a second busbar 17 facing each other. The IDT electrode 3 includes a plurality of first electrode fingers 18 each including one end connected to the first busbar 16. Further, the IDT electrode 3 includes a plurality of second electrode fingers 19 each including one end connected to the second busbar 17. The plurality of first electrode fingers 18 and the plurality of second electrode fingers 19 are interdigitated with each other.

The IDT electrode 3 is made of, for example, a laminated metal film in which a Ti layer, an Al layer, and a Ti layer are laminated in this order from the piezoelectric substrate 2 side. The reflector 8A and the reflector 8B are made of the same material as that of the IDT electrode 3. Note that the materials of the IDT electrode 3, the reflector 8A, and the reflector 8B are not limited to those described above. Alternatively, the IDT electrode 3, the reflector 8A, and the reflector 8B may be made of, for example, a single-layer metal film.

Figure 2:
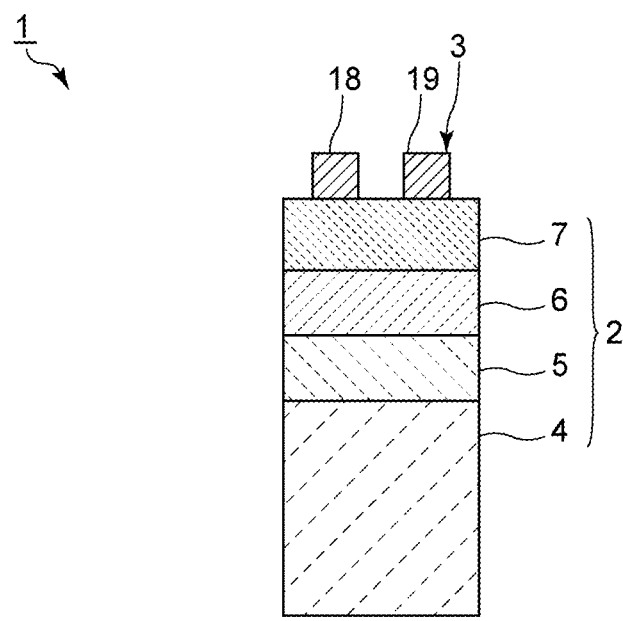
FIG. 2 is a front sectional view taken along a line I-I in FIG. 1, illustrating the vicinity of a pair of electrode fingers in an IDT electrode of the acoustic wave device according to the first preferred embodiment of the present invention.

FIG. 2 is a front sectional view taken along a line I-I in FIG. 1, illustrating the vicinity of a pair of electrode fingers in the IDT electrode 3 of the acoustic wave device according to the first preferred embodiment of the present invention.

The piezoelectric substrate 2 of the acoustic wave device 1 includes a support substrate 4, a silicon nitride film 5 provided on the support substrate 4, a silicon oxide film 6 provided on the silicon nitride film 5, and a piezoelectric layer 7 provided on the silicon oxide film 6. The IDT electrode 3, the reflector 8A, and the reflector 8B are provided on the piezoelectric layer 7.

Figure 3:
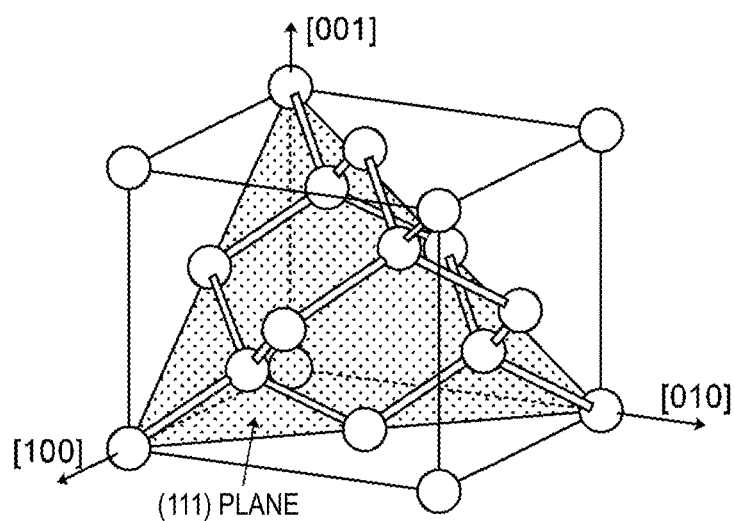
FIG. 3 is a schematic view for explaining a (111) plane of a silicon substrate.

The support substrate 4 of the present preferred embodiment is a silicon substrate, for example. The plane orientation of the support substrate 4 is, for example, Si (111). Here, the plane orientation of the support substrate 4 is the plane orientation of the support substrate 4 on the side of the piezoelectric layer 7. Si (111) refers to a substrate obtained by cutting a crystal structure of silicon having a diamond structure along a (111) plane perpendicular or substantially perpendicular to a crystal axis represented by a Miller index [111]. Note that the (111) plane is the plane illustrated in FIG. 3. However, other crystallographically equivalent planes are also included. In the present preferred embodiment, the Euler angles of the (111) plane of the support substrate 4 are (about −45°, about −54.7°, Ψ). Here, Ψ in the Euler angles of the support substrate 4 is a propagation angle of the support substrate 4. The propagation angle of the support substrate 4 is an angle between the acoustic wave propagation direction and the crystal axis [1-10] of silicon in the (111) plane. From the symmetry of the crystal, Ψ=Ψ+ about 120°.

In the acoustic wave device 1, silicon nitride of the silicon nitride film 5 is, for example, SiN, and silicon oxide of the silicon oxide film 6 is, for example, $SiO_2$. However, the rate of nitrogen in the silicon nitride film 5 and the rate of oxygen in the silicon oxide film 6 are not limited to the above.

The piezoelectric layer 7 is, for example, a lithium tantalate layer. To be more specific, $LiTaO_3$ of Y-cut X-SAW propagation is used for the piezoelectric layer 7. Here, when a wavelength defined by an electrode finger pitch of the IDT electrode 3 is λ, a film thickness of the piezoelectric layer 7 is equal to or less than about 1λ. Note that the "film thickness" of a certain layer (film) refers to the size in a thickness direction of the layer, and refers to the size in a direction in which the support substrate 4, the silicon nitride film 5, the silicon oxide film 6, and the piezoelectric layer 7 are laminated. The Euler angles of the piezoelectric layer 7 are (within a range of about 0°±5°, θ, within a range of about 0°±5°) or (within a range of about 0°±5°, θ, within a range of about 180°±5°). θ in the Euler angles of the piezoelectric layer 7 is about 95.5°≤θ<about 117.5° or about −84.5°≤θ<about −62.5°, which are equivalent to each other.

The present preferred embodiment preferably includes the following features. 1) The piezoelectric substrate 2 is a multilayer body in which the support substrate 4 that is a silicon substrate, the silicon nitride film 5, the silicon oxide film 6, and the piezoelectric layer 7 including Y-cut X-SAW propagation lithium tantalate are laminated in this order. 2) The film thickness of the piezoelectric layer 7 is equal to or less than about 1λ. 3) The relationship between θ in the Euler angles of the piezoelectric layer 7 and the film thickness of the silicon nitride film 5 is a combination shown in Table 5 or 6 described below. As a result, the higher-order mode can be reduced or prevented. This will be described hereinafter in detail. Note that after the case shown in Table 5 is described, the case shown in Table 6 is described.

TABLE 5

| θ | FILM THICKNESS OF SiN FILM | |
|---|---|---|
| | LOWER LIMIT [λ] | UPPER LIMIT [λ] |
| 95.5 ≤ θ < 96.5 | 0.0005 | 0.746 |
| 96.5 ≤ θ < 97.5 | 0.0005 | 0.732 |
| 97.5 ≤ θ < 98.5 | 0.0005 | 0.736 |
| 98.5 ≤ θ < 99.5 | 0.0005 | 0.726 |
| 99.5 ≤ θ < 100.5 | 0.0005 | 0.724 |
| 100.5 ≤ θ < 101.5 | 0.0005 | 0.718 |
| 101.5 ≤ θ < 102.5 | 0.0005 | 0.712 |
| 102.5 ≤ θ < 103.5 | 0.0005 | 0.71 |
| 103.5 ≤ θ < 104.5 | 0.0005 | 0.704 |
| 104.5 ≤ θ < 105.5 | 0.0005 | 0.702 |
| 105.5 ≤ θ < 106.5 | 0.0005 | 0.698 |
| 106.5 ≤ θ < 107.5 | 0.0005 | 0.695 |
| 107.5 ≤ θ < 108.5 | 0.0005 | 0.695 |
| 108.5 ≤ θ < 109.5 | 0.0005 | 0.692 |
| 109.5 ≤ θ < 110.5 | 0.0005 | 0.689 |
| 110.5 ≤ θ < 111.5 | 0.0005 | 0.689 |
| 111.5 ≤ θ < 112.5 | 0.0005 | 0.69 |
| 112.5 ≤ θ < 113.5 | 0.0005 | 0.686 |
| 113.5 ≤ θ < 114.5 | 0.0005 | 0.684 |
| 114.5 ≤ θ < 115.5 | 0.0005 | 0.684 |
| 115.5 ≤ θ < 116.5 | 0.0005 | 0.682 |
| 116.5 ≤ θ < 117.5 | 0.0005 | 0.666 |

TABLE 6

| θ | FILM THICKNESS OF SiN FILM | |
|---|---|---|
| | LOWER LIMIT [λ] | UPPER LIMIT [λ] |
| −84.5 ≤ θ < −83.5 | 0.0005 | 0.746 |
| −83.5 ≤ θ < −82.5 | 0.0005 | 0.732 |
| −82.5 ≤ θ < −81.5 | 0.0005 | 0.736 |
| −81.5 ≤ θ < −80.5 | 0.0005 | 0.726 |
| −80.5 ≤ θ < −79.5 | 0.0005 | 0.724 |
| −79.5 ≤ θ < −78.5 | 0.0005 | 0.718 |
| −78.5 ≤ θ < −77.5 | 0.0005 | 0.712 |
| −77.5 ≤ θ < −76.5 | 0.0005 | 0.71 |
| −76.5 ≤ θ < −75.5 | 0.0005 | 0.704 |
| −75.5 ≤ θ < −74.5 | 0.0005 | 0.702 |
| −74.5 ≤ θ < −73.5 | 0.0005 | 0.698 |
| −73.5 ≤ θ < −72.5 | 0.0005 | 0.695 |
| −72.5 ≤ θ < −71.5 | 0.0005 | 0.695 |
| −71.5 ≤ θ < −70.5 | 0.0005 | 0.692 |
| −70.5 ≤ θ < −69.5 | 0.0005 | 0.689 |
| −69.5 ≤ θ < −68.5 | 0.0005 | 0.689 |
| −68.5 ≤ θ < −67.5 | 0.0005 | 0.69 |
| −67.5 ≤ θ < −66.5 | 0.0005 | 0.686 |
| −66.5 ≤ θ < −65.5 | 0.0005 | 0.684 |
| −65.5 ≤ θ < −64.5 | 0.0005 | 0.684 |
| −64.5 ≤ θ < −63.5 | 0.0005 | 0.682 |
| −63.5 ≤ θ < −62.5 | 0.0005 | 0.666 |

In the acoustic wave device including the same laminated structure as that of the first preferred embodiment, the relationship between θ in the Euler angles of the piezoelectric layer and the film thickness of the silicon nitride film, and the phase of the higher-order mode was obtained. Table 5 shows θ and the range of the film thickness of the silicon nitride film in which the higher-order mode is equal to or less than about −70° and the higher-order mode can be effectively reduced or prevented. Here, conditions of the acoustic wave device are as follows.

Support substrate: material: silicon (Si), plane orientation: Si (111), Euler angles in (111) plane: (about −45°, about −54.7°, about 46°)

Silicon nitride film: film thickness: about 0.0005λ or more and about 1.5λ or less Silicon oxide film: film thickness: about 0.15λ

Piezoelectric layer: material: LiTaO$_3$ of Y-cut X-SAW propagation, film thickness: about 0.2λ, Euler angles: (about 0°, about 96°≤θ≤about 117°, about 0°)

IDT electrode: material: Ti/Al/Ti from the piezoelectric substrate side, film thickness of each layer: about 0.006λ/ about 0.05λ/about 0.002λ from the piezoelectric substrate side Wavelength λ of IDT electrode: about 2 μm Note that FIG. 4 to FIG. 7 show results of the case in which θ in the Euler angles of the piezoelectric layer was changed in a range of about 96°≤θ≤about 117°. It is known that, for example, when the effect of reducing or preventing a spurious component such as the higher-order mode is obtained in the case where θ is $θ_1$, the same or substantially the same advantageous effect is obtained within the range of about $θ_1$±0.5°. Therefore, Table 5 shows the case in the range of about 95.5°≤θ<about 96.5° to the case in the range of about 116.5°≤θ<about 117.5°. Similarly, in tables other than Table 5, a range within θ±about 0.5° may be used for description.

Figure 4:
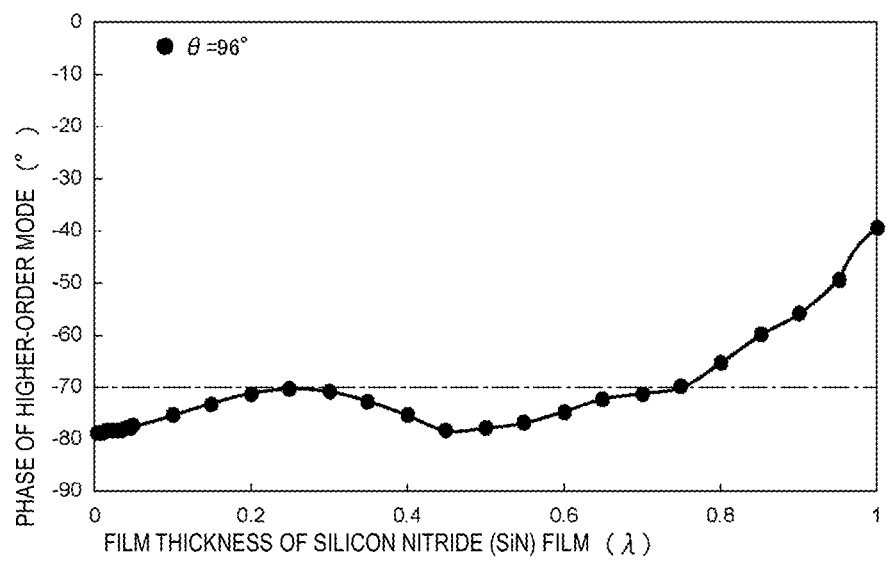
FIG. 4 is a diagram showing the relationship between a film thickness of a silicon nitride film and a phase of a higher-order mode in the case where θ in the Euler angles of a piezoelectric layer is about 96°.
Figure 5:
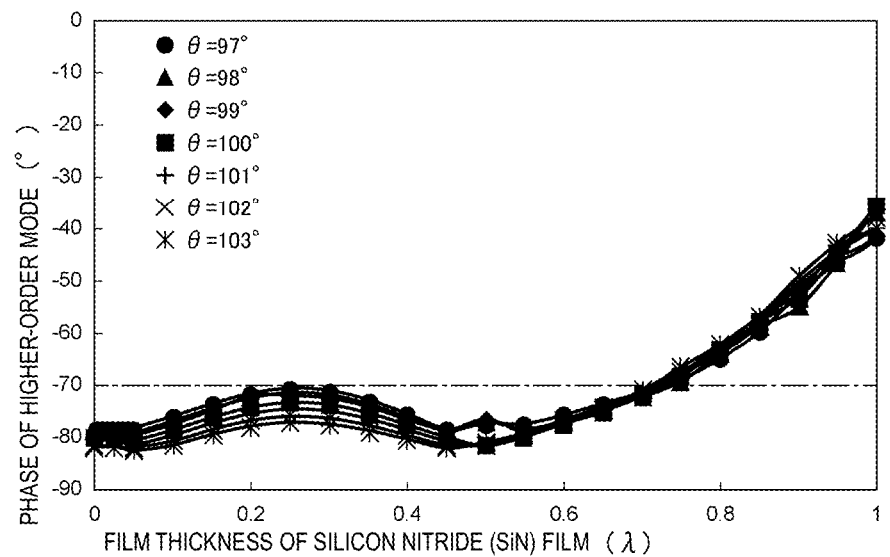
FIG. 5 is a diagram showing the relationship between the film thickness of the silicon nitride film and the phase of the higher-order mode in the case where θ in the Euler angles of the piezoelectric layer is about 97°≤θ≤about 103°.
Figure 6:
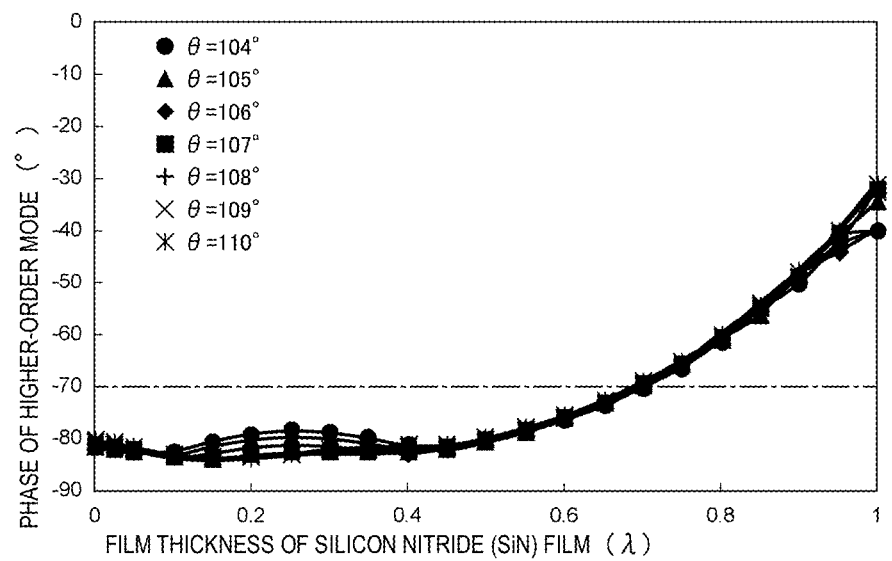
FIG. 6 is a diagram showing the relationship between the film thickness of the silicon nitride film and the phase of the higher-order mode in the case where θ in the Euler angles of the piezoelectric layer is about 104°≤θ≤about 110°.
Figure 7:
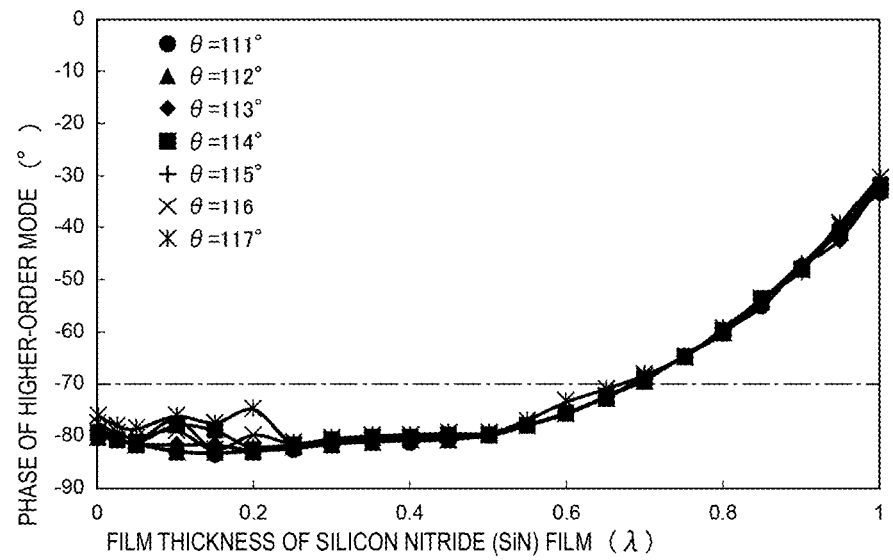
FIG. 7 is a diagram showing the relationship between the film thickness of the silicon nitride film and the phase of the higher-order mode in the case where θ in the Euler angles of the piezoelectric layer is about 111°≤θ≤about 117°.

FIG. 4 is a diagram showing the relationship between the film thickness of the silicon nitride film and the phase of the higher-order mode in the case where θ in the Euler angles of the piezoelectric layer is about 96°. FIG. 5 is a diagram showing the relationship between the film thickness of the silicon nitride film and the phase of the higher-order mode in the case where θ in the Euler angles of the piezoelectric layer is about 97°≤θ≤about 103°. FIG. 6 is a diagram showing the relationship between the film thickness of the silicon nitride film and the phase of the higher-order mode in the case where θ in the Euler angles of the piezoelectric layer is about 104°≤θ≤about 110°. FIG. 7 is a diagram showing the relationship between the film thickness of the silicon nitride film and the phase of the higher-order mode in the case where θ in the Euler angles of the piezoelectric layer is about 111°≤θ≤about 117°.

As shown in FIG. 4, when θ is about 96°, the phase of the higher-order mode is equal to or less than about −70° in the case where the film thickness of the silicon nitride film is in the range of equal to or more than about 0.0005λ and equal to or less than about 0.746λ. The results are shown in Table 5. Similarly, as shown in FIG. 5 to FIG. 7, Table 5 shows the range of the film thickness of the silicon nitride film in which the phase of the higher-order mode is equal to or less than about −70° in the case where θ in the Euler angles of the piezoelectric layer is changed from about 97° to about 117° in increments of about 1°. As described above, in the present preferred embodiment in which the relationship between θ in the Euler angles of the piezoelectric layer and the film thickness of the silicon nitride film is the combination shown in Table 5, it is understood that the higher-order mode can be effectively reduced or prevented. The reason why the higher-order mode can be reduced or prevented is as follows.

For example, the higher-order mode nearly twice the resonant frequency is a Rayleigh-based mode, and has a propagation direction component and a depth direction component. In a certain range of the cut-angles of the piezoelectric body of the piezoelectric layer, a coupling coefficient of the Rayleigh wave becomes small. Similarly, it is considered that the cut-angles of the piezoelectric body also affect the higher-order mode. In addition, it is considered that the plane orientation of silicon of the support substrate affects the higher-order mode. Therefore, it is considered that the higher-order mode can be reduced or prevented by setting the film thickness of the silicon nitride film to such a degree that the wave reaches the support substrate.

Also in the case where θ in the Euler angles of the piezoelectric layer 7 is about −84.5°≤θ<about −62.5°, which is equivalent to the case of about 95.5°≤θ<about 117.5°, the higher-order mode can be reduced or prevented in the same or substantially the same manner as described above. Therefore, even in the case where the relationship between θ and the film thickness of the silicon nitride film 5 is the combination shown in Table 6, the higher-order mode can be reduced or prevented.

In the above description, the case where the propagation angle Ψ in the (111) plane of the support substrate is about 46° has been described, the present invention is not limited thereto. By having the following configuration, in the case where θ in the Euler angles of the piezoelectric layer is about 95.5°≤θ<about 117.5° or about −84.5°≤θ<about −62.5°, the higher-order mode can be further reduced or prevented. 1) The film thickness of the silicon nitride film is equal to or less than about 0.5λ, and the plane orientation of the support substrate is Si (111). 2a) When the Euler angles of the piezoelectric layer is (within a range of about 0°±5°, θ, within a range of about 0°±5°), n represents any integer (0, ±1, ±2), θ in the Euler angles of the piezoelectric layer is about 95.5°≤θ<about 117.5° or about −84.5°≤θ<about −62.5° and the propagation angle Ψ of the support substrate is within a range of about 60°±50°+120°×n. 2b) When the Euler angles of the piezoelectric layer is (within a range of about 0°±5°, θ, within a range of about 180°±5°), n represents any integer (0, ±1, ±2), and θ in the Euler angles of the piezoelectric layer is about 95.5°≤θ<about 117.5° or θ is about −84.5°≤θ<about −62.5°, the propagation angle Ψ of the support substrate is within a range of about 0°±50°+120°×n. This will be described in detail. Note that after the above-described case of 2a) is described, and the above-described case of 2b) is described.

In the acoustic wave device having the same or substantially the same laminated structure as that of the first preferred embodiment, the relationship between θ in the Euler angles of the piezoelectric layer, the film thickness of the silicon nitride film, and the propagation angle Ψ of the support substrate, and the phase of the higher-order mode was obtained. Conditions of the acoustic wave device are as follows.

Support substrate: material: silicon (Si), plane orientation: Si (111), Euler angles in (111) plane: (about −45°, about −54.7°, about 0°≤Ψ'<about 360°)

Silicon nitride film: film thickness: about 0.5λ or less

Silicon oxide film: film thickness: about 0.15λ

Piezoelectric layer: material: LiTaO₃ of Y-cut X-SAW propagation, film thickness: 0.2λ, Euler angles: (about 0°, about 96°≤θ≤about 117°, about 0°)

Figure 8:
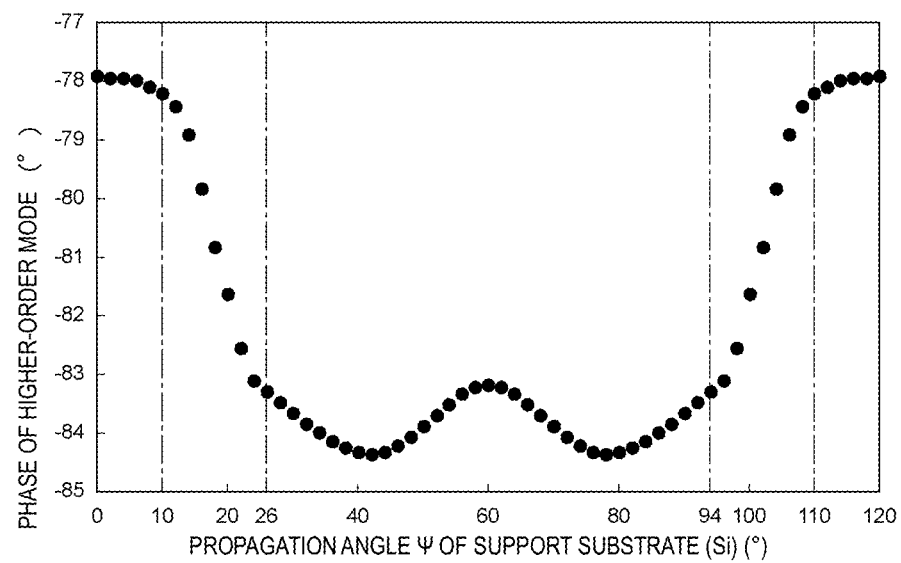
FIG. 8 is a diagram showing the relationship between a propagation angle Ψ of a support substrate and the phase of the higher-order mode.
Figure 9:
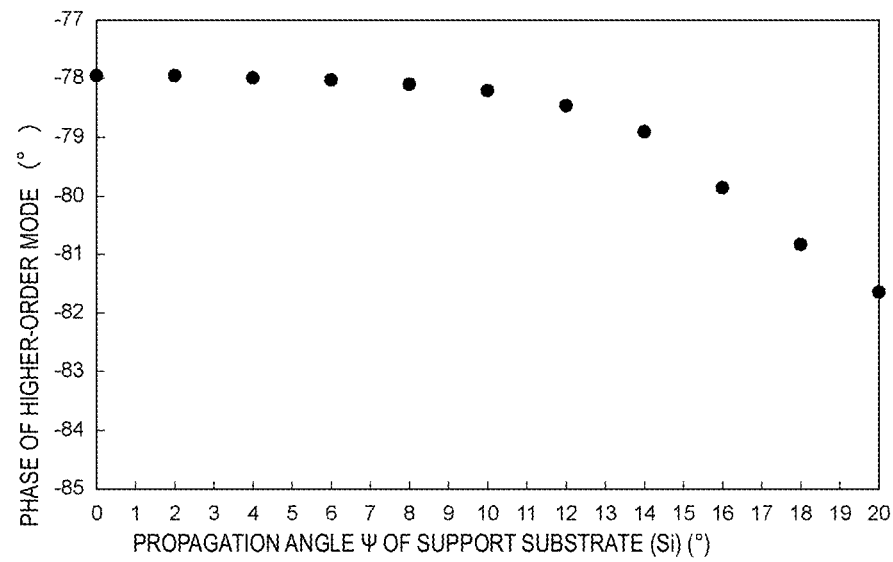
FIG. 9 is an enlarged view of FIG. 8.

IDT electrode: material: Ti/Al/Ti from the piezoelectric substrate side, film thickness of each layer: about 0.006λ/about 0.05λ/about 0.002λ from the piezoelectric substrate side Wavelength λ of IDT electrode: about 2 μm FIG. 8 shows the relationship between the propagation angle Ψ of the support substrate and the phase of the higher-order mode. FIG. 9 is an enlarged view of FIG. 8. Here, since Ψ=Ψ'+about 120°, FIG. 8 shows the case where Ψ is about 0° to about 120°.

As shown in FIG. 8, the phase of the higher-order mode is less than about −77° regardless of the magnitude of the propagation angle Ψ, and the higher-order mode is sufficiently reduced or prevented. In particular, as shown in FIG. 9, it can be seen that in the case where Ψ is equal to or more than about 10°, the value of the phase of the higher-order mode is further reduced. Similarly, in the case where Ψ is equal to or less than about 110°, the value of the phase of the higher-order mode is further reduced. It can be seen that the higher-order mode can be further reduced or prevented in the case where Ψ is in the range of about 60°±50°+120°×n.

Further, as shown in FIG. 8, as the propagation angle Ψ of the support substrate increases to approach 26°, the value of the phase of the higher-order mode rapidly decreases, and in the case of about 26°≤Ψ≤about 60°, the phase of the higher-order mode is further reduced or prevented. Similarly, as Ψ decreases to approach 94°, the value of the phase of the higher-order mode rapidly decreases, and in the case of about 60°≤Ψ≤about 94°, the higher-order mode is further reduced or prevented. Therefore, when Ψ is within the range of about 60°±34°+120°×n, the higher-order mode can be further reduced or prevented. The same or substantially the same applies to the case of (about 0°, about −84°≤θ≤about −63°, about 0°).

Next, from the conditions of the acoustic wave device when the relationship of FIG. 8 was obtained, by changing only the condition of Ψ in the Euler angles (φ, θ, ψ) of the piezoelectric layer, the relationship between ψ, the film thickness of the silicon nitride film, and the propagation angle Ψ of the support substrate, and the phase of the higher-order mode was obtained.

Piezoelectric layer: material: LiTaO₃ of Y-cut X-SAW propagation, film thickness: about 0.2λ, Euler angles: (about 0°, about 96°≤θ≤about 117°, about 180°)

Figure 10:
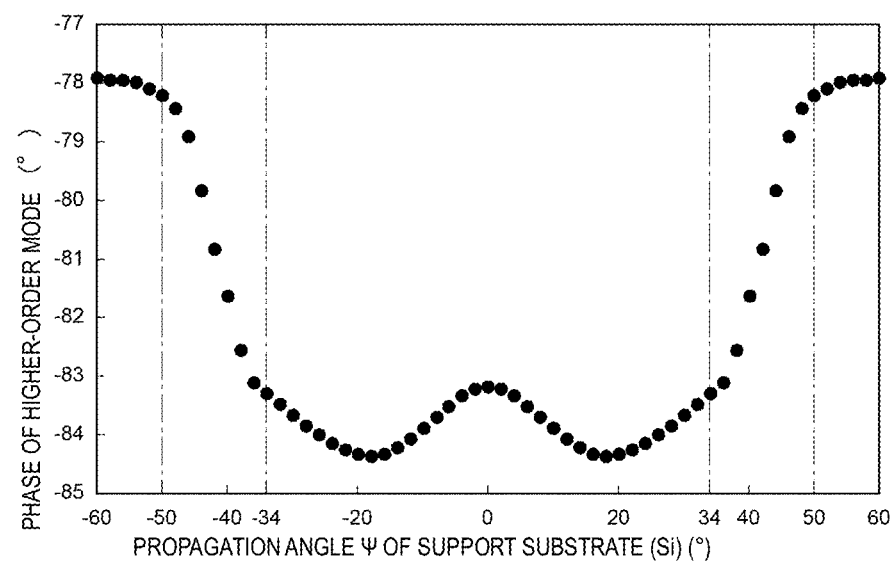
FIG. 10 is a diagram showing the relationship between a propagation angle Ψ of the support substrate and the phase of the higher-order mode.

FIG. 10 is a diagram showing the relationship between the propagation angle Ψ of the support substrate and the phase of the higher-order mode.

As shown in FIG. 10, the phase of the higher-order mode is less than about −77° regardless of the magnitude of the propagation angle Ψ, and the higher-order mode is sufficiently reduced or prevented. In particular, it can be seen that in the case where Ψ is equal to or more than about −50°, the value of the phase of the higher-order mode is further reduced. Similarly, in the case where Ψ is equal to or less than about 50°, the value of the higher-order mode is further reduced. It can be seen that in the case where Ψ is within the range of about 0°±50°+120°×n, the higher-order mode can be further reduced or prevented.

Further, as shown in FIG. 10, as the propagation angle Ψ increases to approach −34°, the value of the phase of the higher-order mode rapidly decreases, and in the case of about −34° about 0°, the phase of the higher-order mode is further reduced or prevented. Similarly, as Ψ decreases to approach 34°, the value of the phase of the higher-order mode rapidly decreases, and in the case of about 0°≤Ψ≤about 34°, the higher-order mode is further reduced or prevented. Therefore, in the case where Ψ is within the range of about 0°±34°+120°×n, the higher-order mode can be further reduced or prevented.

Figure 11:
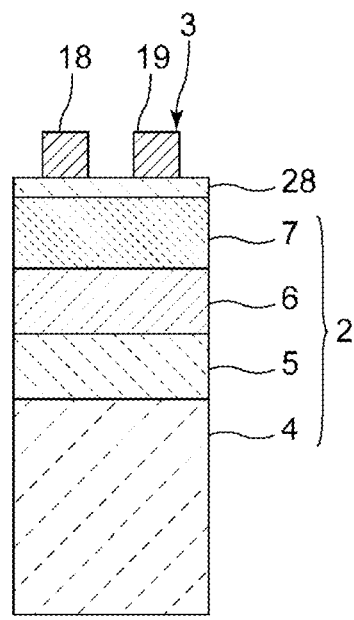
FIG. 11 is a front sectional view illustrating the vicinity of a pair of electrode fingers in an IDT electrode of an acoustic wave device according to a second preferred embodiment of the present invention.

FIG. 11 is a front sectional view illustrating the vicinity of a pair of electrode fingers in an IDT electrode of an acoustic wave device according to a second preferred embodiment of the present invention.

The present preferred embodiment is different from the first preferred embodiment in that a dielectric layer 28 is provided between the piezoelectric layer 7 and the IDT electrode 3. The IDT electrode 3 is directly provided on the piezoelectric layer 7 in the first preferred embodiment, but the IDT electrode 3 may be indirectly provided on the piezoelectric layer 7 with the dielectric layer 28 interposed therebetween as in the present preferred embodiment.

An acoustic velocity of the bulk wave propagating through the dielectric layer 28 is higher than an acoustic velocity of the acoustic wave propagating through the piezoelectric layer 7. In the present preferred embodiment, the dielectric layer 28 is, for example, a silicon nitride layer. Note that the dielectric layer 28 may have a relatively high acoustic velocity, and is not limited to a silicon nitride layer.

Hereinafter, phase characteristics of the acoustic wave device having the configuration of the second preferred embodiment and the acoustic wave device having the configuration of the first preferred embodiment will be described. The conditions of each of the acoustic wave devices are as follows.

Figure 12:
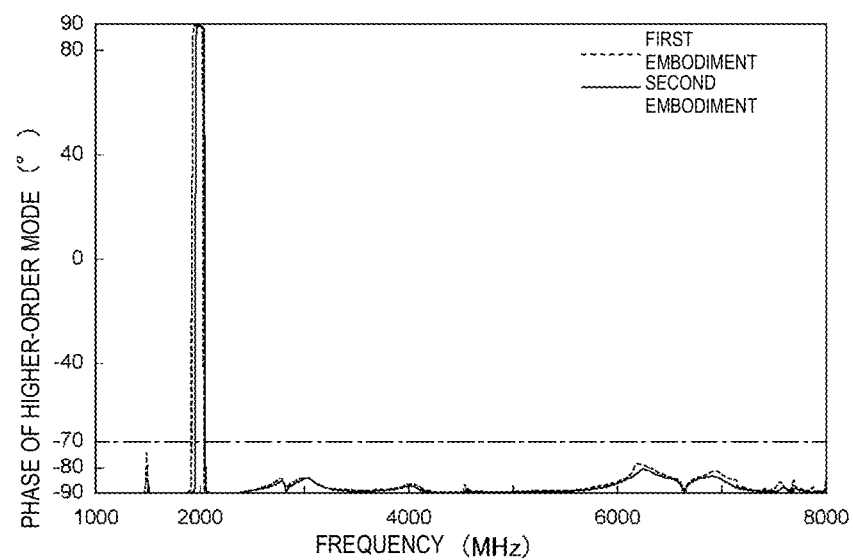
FIG. 12 is a diagram showing phase characteristics of the acoustic wave devices according to the first preferred embodiment and the second preferred embodiment of the present invention.
Figure 13:
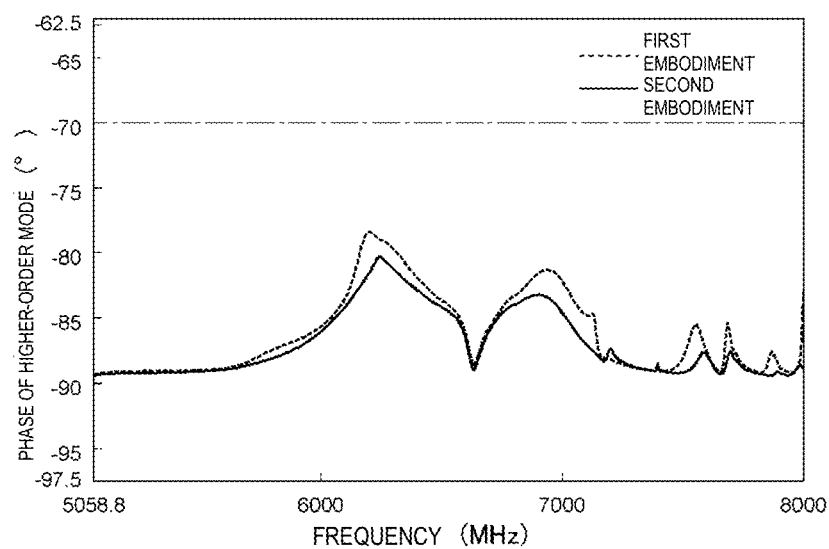
FIG. 13 is an enlarged view of FIG. 12.

Support substrate: material: silicon (Si), plane orientation: Si (111), Euler angles in (111) plane: (−45°, −54.7°, 47°)
Silicon nitride film: film thickness: about 0.15λ,
Silicon oxide film: film thickness: about 0.15λ,
Piezoelectric layer: material: LiTaO₃ of Y-cut X-SAW propagation, film thickness: about 0.2λ, Euler angles: (about 0°, about 110°, about 0°)
IDT electrode: material: Ti/Al/Ti from the piezoelectric substrate side, film thickness of each layer: about 0.006λ/about 0.05λ/about 0.002λ from the piezoelectric substrate side
Wavelength λ of IDT electrode: about 2 μm FIG. 12 is a diagram showing phase characteristics of the acoustic wave devices according to the first preferred embodiment and the second preferred embodiment. FIG. 13 is an enlarged view of FIG. 12. In FIG. 12 and FIG. 13, the solid line indicates the result of the second preferred embodiment, and the broken line indicates the result of the first preferred embodiment.

As shown in FIG. 12 and FIG. 13, in the first preferred embodiment and the second preferred embodiment, the higher-order mode can be effectively reduced or prevented. In particular, it can be seen that the higher-order mode can be further reduced or prevented in the second preferred embodiment. In the second preferred embodiment, since the high-acoustic-velocity dielectric layer is provided, the acoustic velocity of the higher-order mode increases. As a result, the higher-order mode is leaked in a bulk direction, so that the higher-order mode on the high-frequency side can be further reduced or prevented.

Here, for example, in the case where an SH wave or the like is used as a main mode, a Rayleigh wave becomes spurious. In the case where the dielectric layer 28 is a SiN layer, a Rayleigh wave as a spurious component can also be reduced or prevented by having the configuration described later. This will be described in detail.

The relationship between θ in the Euler angles of the piezoelectric layer and the film thickness of the dielectric layer, and the phase of the Rayleigh wave in the acoustic wave device having the configuration of the second preferred embodiment was obtained. Conditions of the acoustic wave device are as follows.

Support substrate: material: silicon (Si), plane orientation: Si (111), Euler angles in (111) plane: (−45°, −54.7°, 47°)
Silicon nitride film: film thickness: about 0.15λ
Silicon oxide film: film thickness: about 0.15λ
Piezoelectric layer: material: LiTaO₃ of Y-cut X-SAW propagation, film thickness: about 0.2λ, Euler angles: (about 0°, about 96°≤θ≤about 117°, about 0°)
IDT electrode: material: Ti/Al/Ti from the piezoelectric substrate side, film thickness of each layer: about 0.006λ/about 0.05λ/about 0.002λ from the piezoelectric substrate side
Wavelength λ of IDT electrode: about 2 μm
Dielectric layer: material: SiN, film thickness: about 0.0025λ or more and about 0.0975λ or less FIG. 14 is a diagram showing the relationship between θ in the Euler angles of the piezoelectric layer and the film thickness of the silicon nitride layer, and the phase of the Rayleigh wave in the case where the dielectric layer is a silicon nitride layer.

Figure 14:
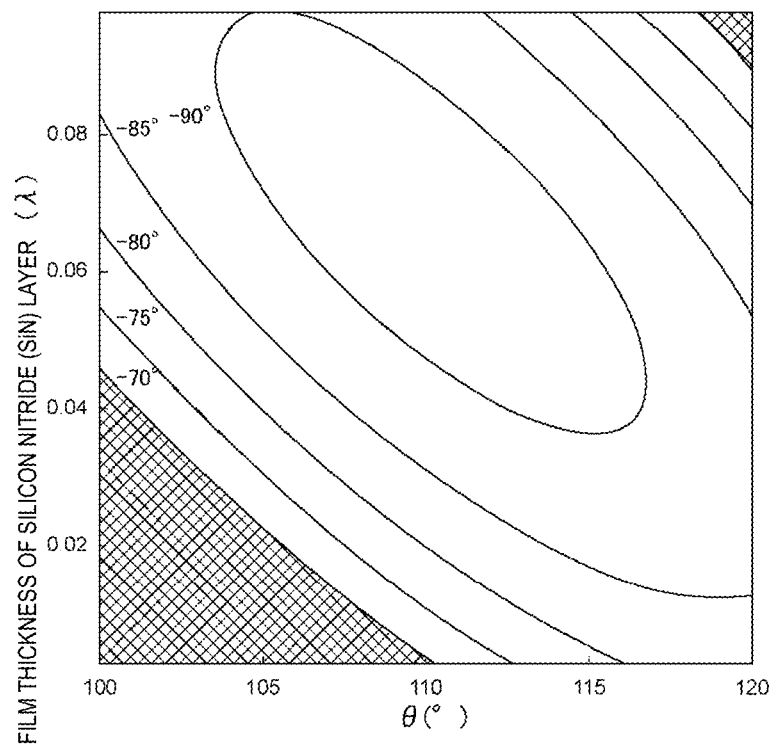
FIG. 14 is a diagram showing the relationship between θ in the Euler angles of the piezoelectric layer and a film thickness of a silicon nitride layer, and a phase of a Rayleigh wave.

The range other than the hatched range shown in FIG. 14 is a range in which the phase of the Rayleigh wave is equal to or less than about −70°, for example. Here, the relationship shown in FIG. 14 is expressed by Equation 1 described below. Note that in Equation 1, the film thickness of the silicon nitride layer is referred to as SiN film thickness.

Phase of Rayleigh wave=(−81.6949045454545)+(−0.67490613636364)×(θ−110)+(−189.247997265892)×(("SiN film thickness [λ]")−0.05)+0.111730638111889×((θ−110)×(θ−110)−40)+36.1595358851675×((θ−110)×(("SiN film thickness [λ]")−0.05))+5258.22469396632×((("SiN film thickness [λ]")−0.05)×(("SiN film thickness [λ]")−0.05)−0.00083125)   Equation 1

θ in the Euler angles of the piezoelectric layer and the film thickness of the silicon nitride layer are preferably an angle and a film thickness within a range in which the phase of the Rayleigh wave derived by Equation 1 is equal to or less than about −70°, for example. In this case, the Rayleigh wave can be effectively reduced or prevented in addition to the reduction or prevention of the higher-order mode.

As described above, the dielectric layer is not limited to a silicon nitride layer. For example, even in the case where the dielectric layer is an aluminum oxide layer or an aluminum nitride layer, the Rayleigh wave can be effectively reduced or prevented in addition to the higher-order mode. This will be shown hereinafter.

The relationship between θ in the Euler angles of the piezoelectric layer and the film thickness of the aluminum oxide layer, and the phase of the Rayleigh wave was obtained. On the other hand, the relationship between θ in the Euler angles of the piezoelectric layer and the film thickness of the aluminum nitride layer, and the phase of the Rayleigh wave was obtained. Note that the conditions of the acoustic wave device are the same or substantially the same as the conditions when obtaining the relationship shown in FIG. 14 except that the material of the dielectric layer is $Al_2O_3$ or AlN.

Figure 15:
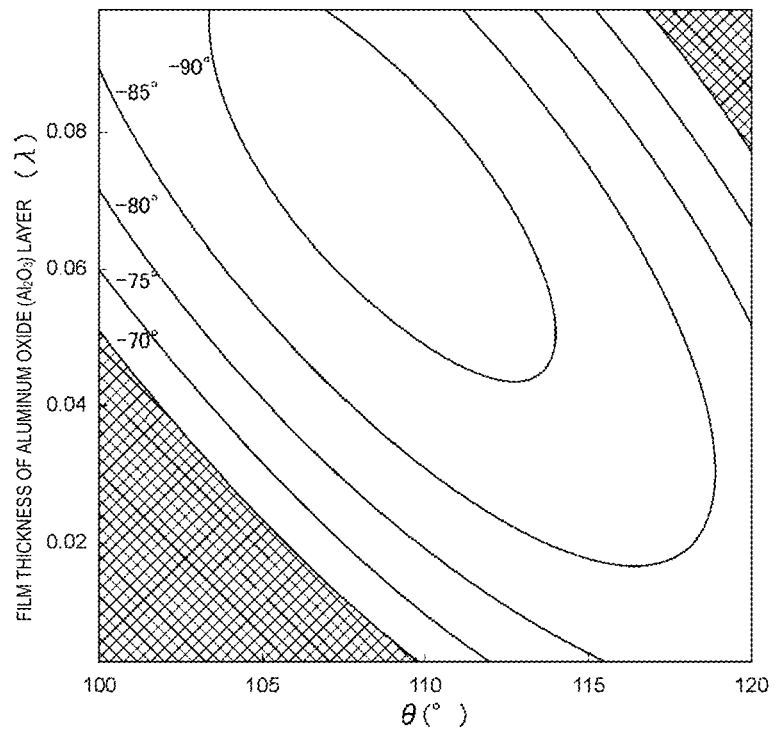
FIG. 15 is a diagram showing the relationship between θ in the Euler angles of the piezoelectric layer and a film thickness of an aluminum oxide layer, and the phase of the Rayleigh wave.

FIG. 15 is a diagram showing the relationship between θ in the Euler angles of the piezoelectric layer and the film thickness of the aluminum oxide layer, and the phase of the Rayleigh wave in the case where the dielectric layer is the aluminum oxide layer.

The range other than the hatched range shown in FIG. 15 is a range in which the phase of the Rayleigh wave is equal to or less than about −70°, for example. Here, the relationship shown in FIG. 15 is expressed by Equation 2 described below. Note that in Equation 2, the film thickness of the aluminum oxide layer is referred to as $Al_2O_3$ film thickness.

Phase of Rayleigh wave=(−80.1333863636364)+(−0.554522499999998)×(θ−110)+(−173.463554340396)×(("Al2O3 film thickness [λ]")−0.05)+0.149698033216783×((θ−110)×(θ−110)−40)+41.1703301435407×((θ−110)*(("Al2O3 film thickness [λ]")−0.05))+4990.83763126825×((("Al2O3 film thickness [λ]")−0.05)×(("Al2O3 film thickness [λ]")−0.05)−0.00083125)    Equation 2

θ in the Euler angles of the piezoelectric layer and the film thickness of the aluminum oxide layer are preferably an angle and a film thickness within a range in which the phase of the Rayleigh wave derived by Equation 2 is equal to or less than about −70°, for example. In this case, the Rayleigh wave can be effectively reduced or prevented in addition to the reduction or prevention of the higher-order mode.

Figure 16:
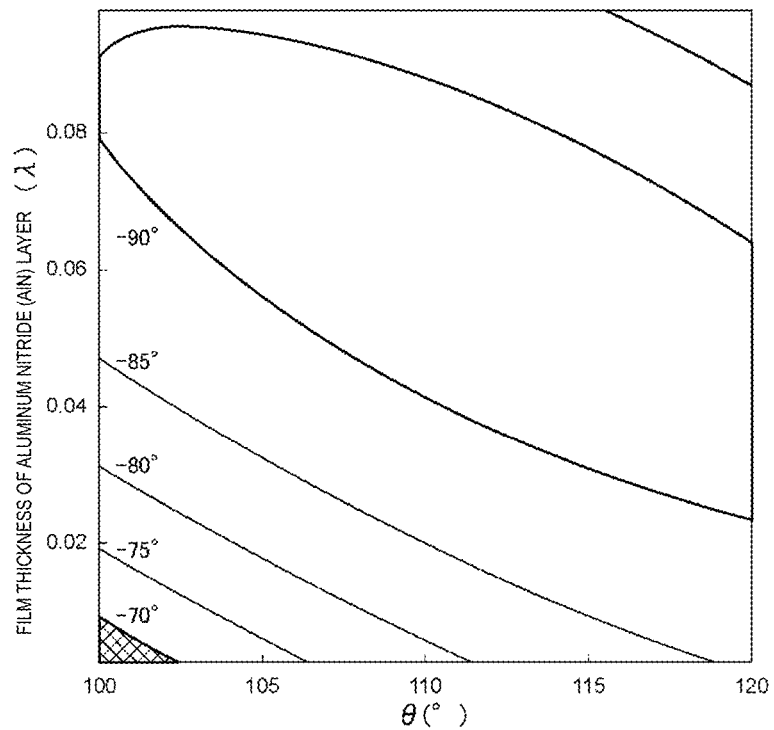
FIG. 16 is a diagram showing the relationship between θ in the Euler angles of the piezoelectric layer and a film thickness of an aluminum nitride layer, and the phase of the Rayleigh wave.

FIG. 16 is a diagram showing the relationship between θ in the Euler angles of the piezoelectric layer and the film thickness of the aluminum nitride layer, and the phase of the Rayleigh wave in the case where the dielectric layer is the aluminum nitride layer.

The range other than the hatched range shown in FIG. 16 is a range in which the phase of the Rayleigh wave is equal to or less than about −70°, for example. Here, the relationship shown in FIG. 16 is expressed by Equation 3 described below. Note that in Equation 3, the film thickness of the aluminum nitride layer is referred to as AlN film thickness or AlN β.

Phase of Rayleigh wave=(−87.3504136363636)+(−0.270137500000004)×(θ−110)+(−97.7367464114832)×(("AlN film thickness [λ]")−0.05)+0.0257423222610727×((θ−110)×(θ−110)−40)+14.0575563909775×((θ−110)×(("AlN β [λ]")−0.05))+3335.40856272914×((("AlN film thickness [λ]")−0.05)×(("AlN film thickness [λ]")−0.05)−0.00083125)    Equation 3

θ in the Euler angles of the piezoelectric layer and the film thickness of the aluminum nitride layer are preferably an angle and a film thickness within a range in which the phase of the Rayleigh wave derived by Equation 3 is equal to or less than about −70°, for example. In this case, the Rayleigh wave can be effectively reduced or prevented in addition to the reduction or prevention of the higher-order mode.

In the first preferred embodiment and the second preferred embodiment, the case where θ in the Euler angles of the piezoelectric layer satisfies about 95.5 0<117.5° is described. Hereinafter, the configuration capable of reducing or preventing the higher-order mode even in the case of about 117.5°≤θ<129.5° or about 85.5°≤θ<95.5° will be described. Details of a third preferred embodiment of the present invention having the same or substantially the same configuration as the first preferred embodiment except that about 117.5°≤θ<129.5° is satisfied will be described with reference to FIG. 17 to FIG. 21. Details of a fourth preferred embodiment of the present invention having the same or substantially the same configuration as the first preferred embodiment except that about 85.5°≤θ<95.5° is satisfied will be described with reference to FIG. 22 to FIG. 24.

An acoustic wave device according to the third preferred embodiment can reduce or prevent the higher-order mode with the following configuration. 1) The piezoelectric substrate is a multilayer body including a support substrate that is a silicon substrate, a silicon nitride film, a silicon oxide film, and a piezoelectric layer using lithium tantalate that are laminated in this order. 2) The film thickness of the piezoelectric layer is equal to or less than about 1λ. 3) The relationship between θ in the Euler angles of the piezoelectric layer and the film thickness of the silicon nitride film is a combination shown in Table 7 described below.

TABLE 7

| θ | FILM THICKNESS OF SiN FILM | |
|---|---|---|
| | LOWER LIMIT [λ] | UPPER LIMIT [λ] |
| 117.5 ≤ θ < 118.5 | 0.0005 | 0.092 |
| 117.5 ≤ θ < 118.5 | 0.166 | 0.597 |
| 118.5 ≤ θ < 119.5 | 0.0005 | 0.07 |
| 118.5 ≤ θ < 119.5 | 0.168 | 0.554 |
| 119.5 ≤ θ < 120.5 | 0.005 | 0.063 |
| 119.5 ≤ θ < 120.5 | 0.152 | 0.522 |
| 120.5 ≤ θ < 121.5 | 0.004 | 0.06 |
| 120.5 ≤ θ < 121.5 | 0.132 | 0.492 |
| 121.5 ≤ θ < 122.5 | 0.022 | 0.052 |
| 121.5 ≤ θ < 122.5 | 0.12 | 0.466 |
| 122.5 ≤ θ < 123.5 | 0.22 | 0.43 |
| 123.5 ≤ θ < 124.5 | 0.24 | 0.4 |
| 124.5 ≤ θ < 125.5 | 0.25 | 0.38 |
| 125.5 ≤ θ < 126.5 | 0.25 | 0.38 |
| 126.5 ≤ θ < 127.5 | 0.25 | 0.36 |
| 127.5 ≤ θ < 128.5 | 0.25 | 0.31 |
| 128.5 ≤ θ < 129.5 | 0.25 | 0.28 |

From the conditions of the acoustic wave device when the relationship of FIG. 4 to FIG. 7 was obtained, by changing only the condition of θ in the Euler angles of the piezoelectric layer, the relationship between θ and the film thickness of the silicon nitride film, and the phase of the higher-order mode was obtained.

Piezoelectric layer: material: $LiTaO_3$ of Y-cut X-SAW propagation, film thickness: about 0.2λ, Euler angles: (0°, 118°≤θ≤129°, 0°)

Figure 17:
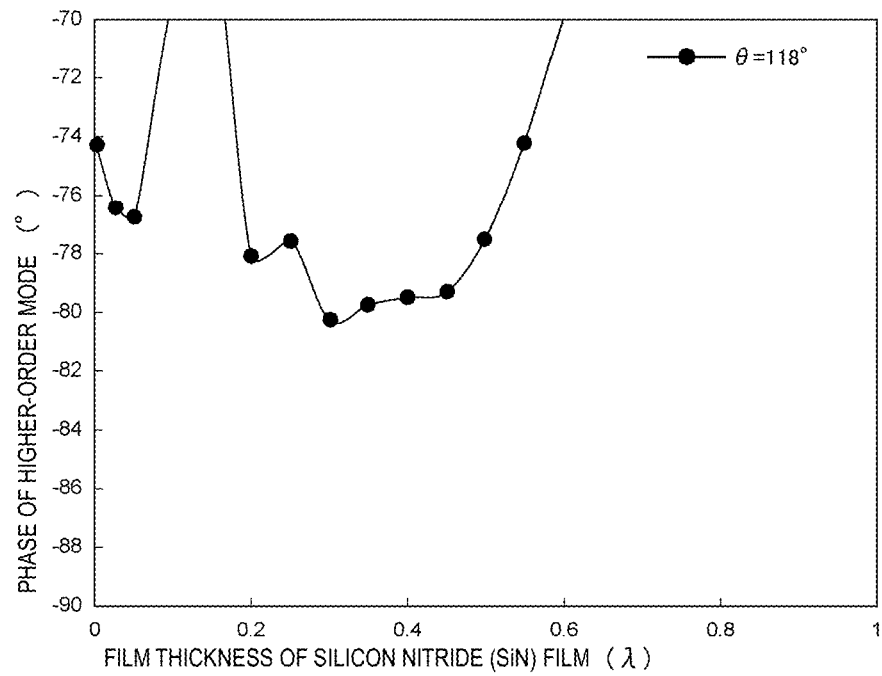
FIG. 17 is a diagram showing the relationship between the film thickness of the silicon nitride film and the phase of the higher-order mode in the case where θ in the Euler angles of the piezoelectric layer is about 118°.
Figure 18:
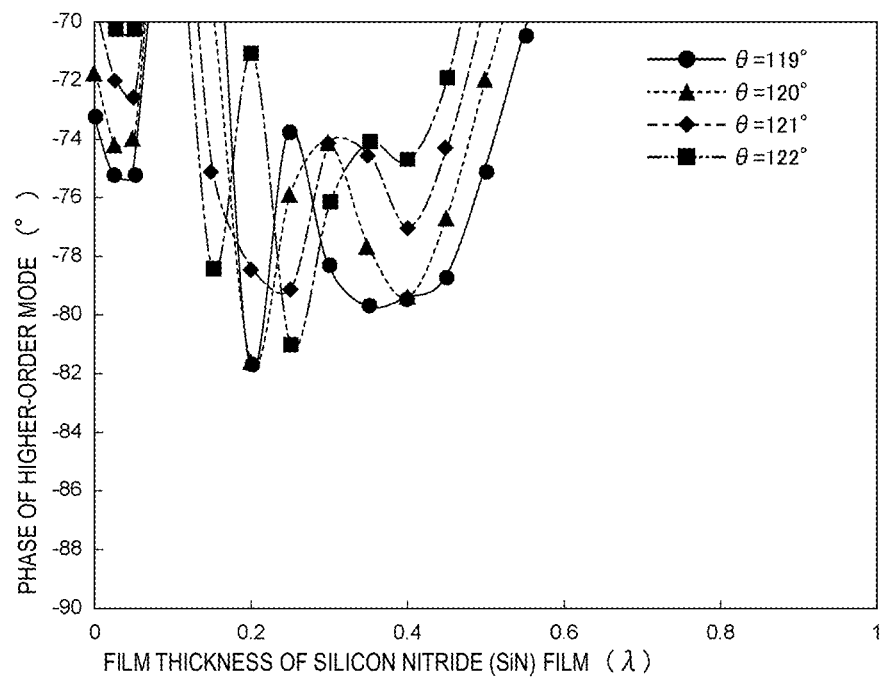
FIG. 18 is a diagram showing the relationship between the film thickness of the silicon nitride film and the phase of the higher-order mode in the case where θ in the Euler angles of the piezoelectric layer is about 119°≤θ≤about 122°.
Figure 19:
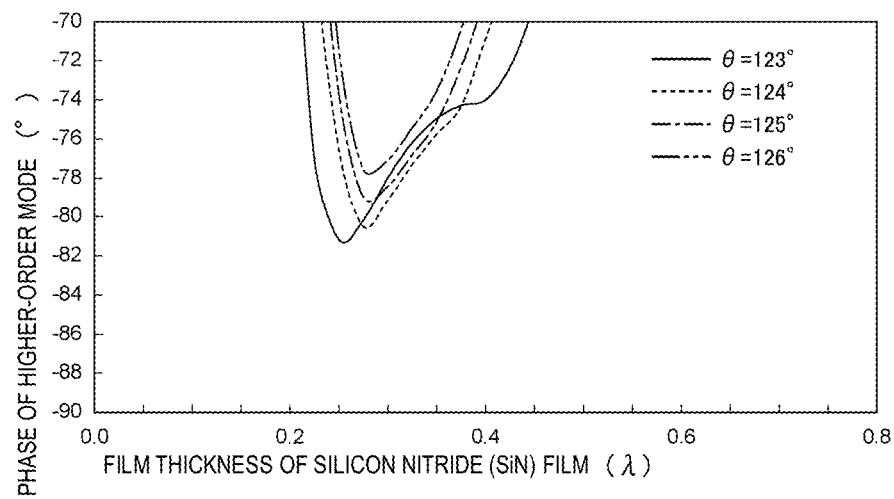
FIG. 19 is a diagram showing the relationship between the film thickness of the silicon nitride film and the phase of the higher-order mode in the case where θ in the Euler angles of the piezoelectric layer is about 123°≤θ≤about 126°.
Figure 20:
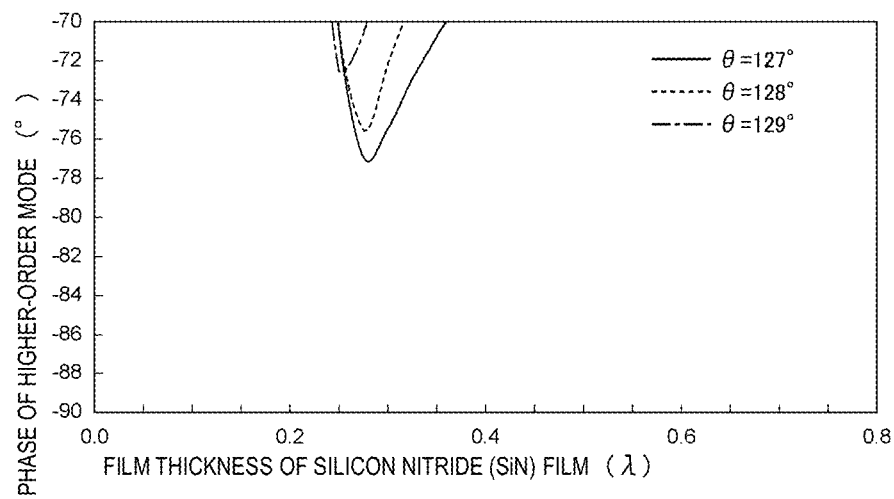
FIG. 20 is a diagram showing the relationship between the film thickness of the silicon nitride film and the phase of the higher-order mode in the case where θ in the Euler angles of the piezoelectric layer is about 127°≤θ≤about 129°.
Figure 21:
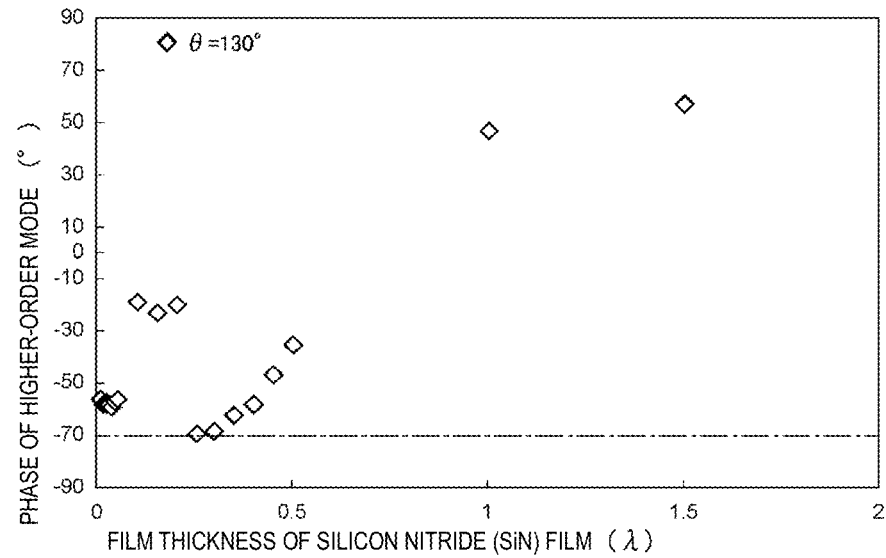
FIG. 21 is a diagram showing the relationship between the film thickness of the silicon nitride film and the phase of the higher-order mode in the case where θ in the Euler angles of the piezoelectric layer is about 130°.

FIG. 17 is a diagram showing the relationship between the film thickness of the silicon nitride film and the phase of the higher-order mode in the case where θ in the Euler angles of the piezoelectric layer is about 118°. FIG. 18 is a diagram showing the relationship between the film thickness of the silicon nitride film and the phase of the higher-order mode in the case where θ in the Euler angles of the piezoelectric layer is about 119°≤θ≤122°. FIG. 19 is a diagram showing the relationship between the film thickness of the silicon nitride film and the phase of the higher-order mode in the case where θ in the Euler angles of the piezoelectric layer is about 123°≤θ≤126°. FIG. 20 is a diagram showing the relationship between the film thickness of the silicon nitride film and the phase of the higher-order mode in the case where θ in the Euler angles of the piezoelectric layer is about 127°≤θ≤129°. FIG. 21 is a diagram showing the relationship between the film thickness of the silicon nitride film and the phase of the higher-order mode in the case where θ in the Euler angles of the piezoelectric layer is about 130°.

As shown in FIG. 17, in the case where θ is about 118°, the phase of the higher-order mode is equal to or less than about −70° in the range of the film thickness of the silicon nitride film of equal to or more than about 0.0005λ and equal to or less than about 0.092λ or in the range of equal to or more than about 0.166λ and equal to or less than about 0.597λ. The results are shown in Table 7. Similarly, as shown in FIG. 18 to FIG. 20, in the case where θ in the Euler angles of the piezoelectric layer is changed from about 119° to about 129° in increments of 1°, the range of the film thickness of the silicon nitride film in which the phase of the higher-order mode is equal to or less than about −70° is shown in Table 7.

On the other hand, as shown in FIG. 21, in the case where θ is about 130°, the phase of the higher-order mode exceeds about −70° in the range in which the film thickness of the silicon nitride film is equal to or less than about 1.5λ, and it is difficult to sufficiently suppress the phase of the higher-order mode. As described above, it can be seen that in the case where the relationship between θ in the Euler angles of the piezoelectric layer and the film thickness of the silicon nitride film is the combination shown in Table 7, the higher-order mode can be effectively reduced or prevented.

An acoustic wave device according to the fourth preferred embodiment can suppress the higher-order mode by having the following configuration. 1) The piezoelectric substrate is a multilayer body including a support substrate that is a silicon substrate, a silicon nitride film, a silicon oxide film, and a piezoelectric layer using lithium tantalate that are laminated in this order. 2) The film thickness of the piezoelectric layer is equal to or less than about 1λ. 3) The relationship between θ in the Euler angles of the piezoelectric layer and the film thickness of the silicon nitride film is a combination shown in Table 8 described below.

TABLE 8

| θ | FILM THICKNESS OF SiN FILM | |
|---|---|---|
|   | LOWER LIMIT [λ] | UPPER LIMIT [λ] |
| 85.5 ≤ θ < 86.5 | 0.0005 | 0.03 |
| 85.5 ≤ θ < 86.5 | 0.43 | 0.46 |
| 86.5 ≤ θ < 87.5 | 0.0005 | 0.038 |
| 86.5 ≤ θ < 87.5 | 0.42 | 0.47 |
| 87.5 ≤ θ < 88.5 | 0.0005 | 0.048 |
| 87.5 ≤ θ < 88.5 | 0.412 | 0.485 |
| 88.5 ≤ θ < 89.5 | 0.0005 | 0.058 |
| 88.5 ≤ θ < 89.5 | 0.404 | 0.506 |
| 89.5 ≤ θ < 90.5 | 0.0005 | 0.07 |
| 89.5 ≤ θ < 90.5 | 0.388 | 0.52 |
| 90.5 ≤ θ < 91.5 | 0.0005 | 0.085 |
| 90.5 ≤ θ < 91.5 | 0.37 | 0.538 |
| 91.5 ≤ θ < 92.5 | 0.0005 | 0.102 |
| 91.5 ≤ θ < 92.5 | 0.346 | 0.56 |
| 92.5 ≤ θ < 93.5 | 0.0005 | 0.128 |
| 92.5 ≤ θ < 93.5 | 0.315 | 0.59 |
| 93.5 ≤ θ < 94.5 | 0.0005 | 0.166 |
| 93.5 ≤ θ < 94.5 | 0.295 | 0.616 |
| 94.5 ≤ θ < 95.5 | 0.0005 | 0.226 |
| 94.5 ≤ θ < 95.5 | 0.284 | 0.66 |

From the conditions of the acoustic wave device when the relationship of FIG. 4 to FIG. 7 was obtained, by changing only the condition of θ in the Euler angles of the piezoelectric layer, the relationship between θ and the film thickness of the silicon nitride film, and the phase of the higher-order mode was obtained.

Piezoelectric layer: material: $LiTaO_3$ of Y-cut X-SAW propagation, film thickness: about 0.2λ, Euler angles: (0°, 86° 95°, 0°)

Figure 22:
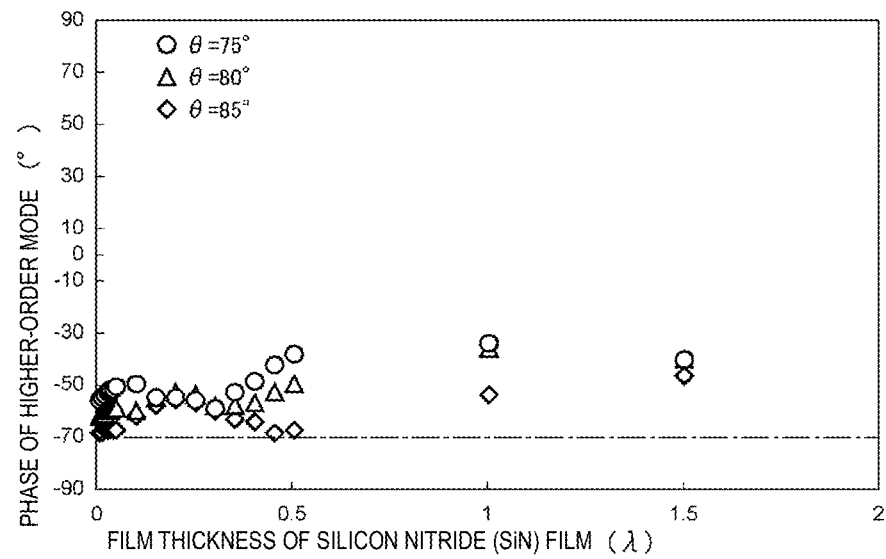
FIG. 22 is a diagram showing the relationship between the film thickness of the silicon nitride film and the phase of the higher-order mode in the case where θ in the Euler angles of the piezoelectric layer is about 75°≤θ≤about 85°.
Figure 23:
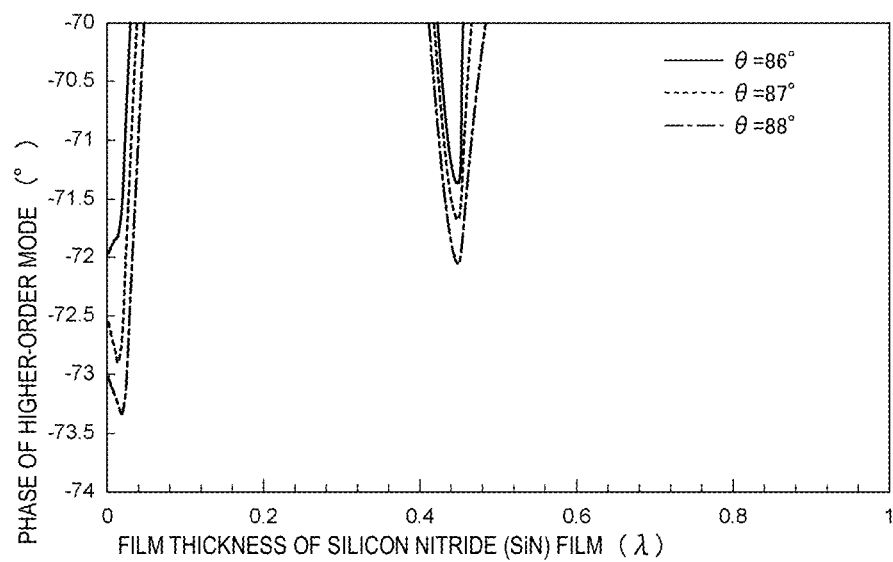
FIG. 23 is a diagram showing the relationship between the film thickness of the silicon nitride film and the phase of the higher-order mode in the case where θ in the Euler angles of the piezoelectric layer is about 86°≤θ≤about 88°.
Figure 24:
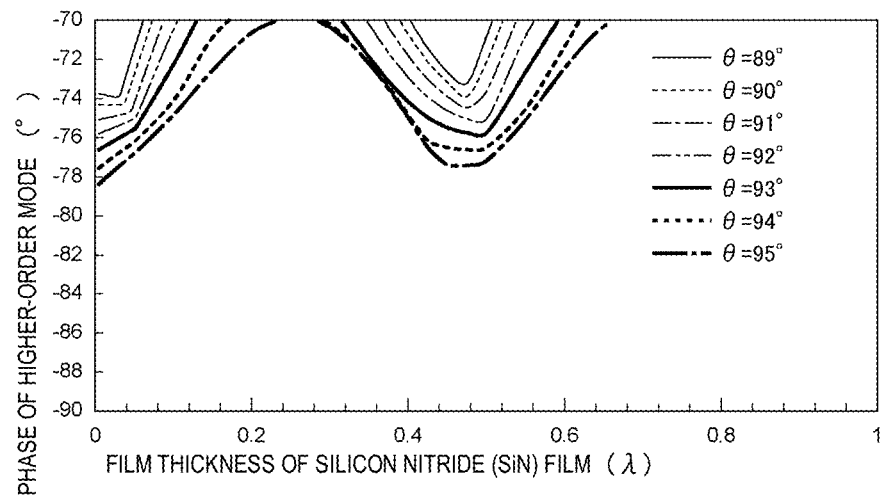
FIG. 24 is a diagram showing the relationship between the film thickness of the silicon nitride film and the phase of the higher-order mode in the case where θ in the Euler angles of the piezoelectric layer is about 89°≤θ≤about 95°.

FIG. 22 is a diagram showing the relationship between the film thickness of the silicon nitride film and the phase of the higher-order mode in the case where θ in the Euler angles of the piezoelectric layer is about 75°≤θ≤85°. FIG. 23 is a diagram showing the relationship between the film thickness of the silicon nitride film and the phase of the higher-order mode in the case where θ in the Euler angles of the piezoelectric layer is about 86°≤θ≤88°. FIG. 24 is a diagram showing the relationship between the film thickness of the silicon nitride film and the phase of the higher-order mode in the case where θ in the Euler angle of the piezoelectric layer is about 89°≤θ≤95°.

As shown in FIG. 22, in the case where θ is about 75° 85°, the phase of the higher-order mode exceeds about −70° in the range in which the film thickness of the silicon nitride film is equal to or less than about 1.5λ, and it is difficult to sufficiently reduce or prevent the phase of the higher-order mode.

On the other hand, as shown in FIG. 23, in the case where θ is about 86°, the phase of the higher-order mode is equal to or less than about −70° in the range in which the film thickness of the silicon nitride film is equal to or more than 0.0005λ and equal to or less than about 0.03λ or in the range of in which the film thickness is equal to or more than about 0.43λ and equal to or less than about 0.46λ. The results are shown in Table 8. Similarly, as shown in FIG. 23 and FIG. 24, in the case where θ in the Euler angles of the piezoelectric layer is changed from about 87° to about 95° in increments of 1°, the range of the film thickness of the silicon nitride film in which the phase of the higher-order mode is equal to or less than about −70° is shown in Table 8. As described above, it can be seen that in the case where the relationship between θ in the Euler angles of the piezoelectric layer and the film thickness of the silicon nitride film is the combination shown in Table 8, the higher-order mode can be effectively reduced or prevented.

Figure 25:
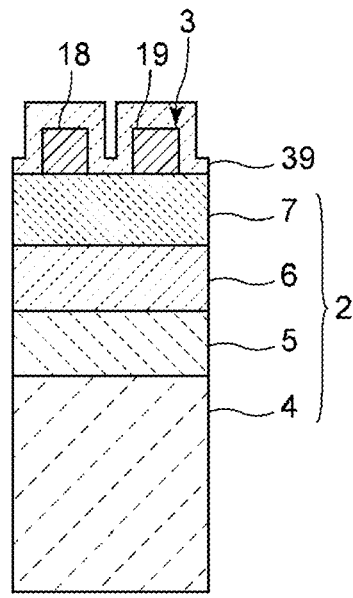
FIG. 25 is a front sectional view illustrating the vicinity of a pair of electrode fingers in an IDT electrode of an acoustic wave device according to a fifth preferred embodiment of the present invention.

FIG. 25 is a front sectional view illustrating the vicinity of a pair of electrode fingers in an IDT electrode of an acoustic wave device according to a fifth preferred embodiment of the present invention.

The present preferred embodiment is different from the first preferred embodiment in that a protective film 39 is provided on the piezoelectric layer 7 so as to cover the IDT electrode 3. A material of the protective film 39 of the present preferred embodiment is, for example, silicon nitride. More specifically, the protective film 39 is, for example, a SiN protective film made of SiN. Note that the rate of nitrogen in the silicon nitride of the protective film 39 is not limited to the above. Alternatively, the material of the protective film 39 is not limited to silicon nitride, and may be, for example, aluminum nitride or aluminum oxide.

The acoustic wave device of the present preferred embodiment can reduce or prevent not only the higher-order mode, but also a Rayleigh wave as a spurious component by having the configuration described later. This will be described in detail.

The relationship between θ in the Euler angles of the piezoelectric layer and the film thickness of the protective film and the phase of the Rayleigh wave in the acoustic wave device having the configuration of the fifth preferred embodiment was obtained. Conditions of the acoustic wave device are as follows.

Support substrate: material: silicon (Si), plane orientation: Si (111), Euler angles in (111) plane: (−45°, −54.7°, 46°)
Silicon nitride film: film thickness: about 0.15λ,
Silicon oxide film: film thickness: about 0.15λ,
Piezoelectric layer: material: $LiTaO_3$ of Y-cut X-SAW propagation, film thickness: about 0.2λ, Euler angles: (0°, 96°≤θ≤117°, 0°)

IDT electrode: material: Ti/Al/Ti from the piezoelectric substrate side, film thickness of each layer: about 0.006λ/about 0.05λ/about 0.002λ from the piezoelectric substrate side Wavelength λ of IDT electrode: about 2 μm Protective film: material: SiN, film thickness: about 0.005λ or more and about 0.05λ or less FIG. 26 is a diagram showing the relationship between θ in the Euler angles of the piezoelectric layer and the film thickness of the SiN protective film, and the phase of the Rayleigh wave and the higher-order mode.

Figure 26:
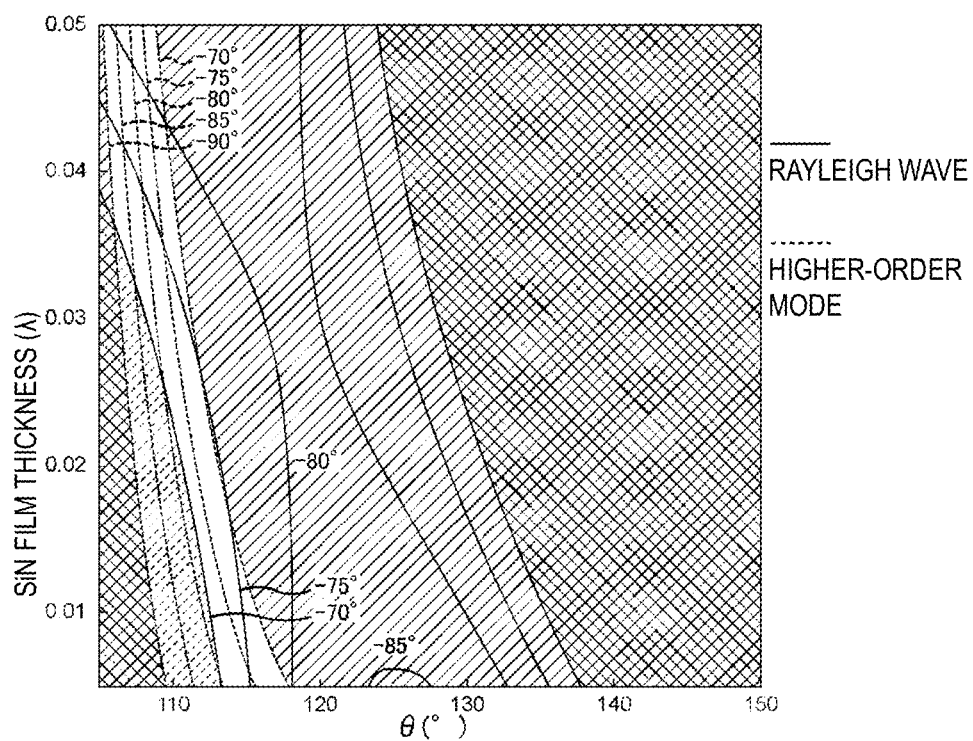
FIG. 26 is a diagram showing the relationship between θ in the Euler angles of the piezoelectric layer and a film thickness of a SiN protective film, and the phase of the Rayleigh wave and the higher-order mode.

The range other than the hatched range shown in FIG. 26 is a range in which the phase of the higher-order mode is equal to or less than about −70° and the phase of the Rayleigh wave is equal to or less than about −70°. Here, the relationship between θ in the Euler angles of the piezoelectric layer and the film thickness of the SiN protective film, and the phase of the Rayleigh wave shown in FIG. 26 is expressed by Equation 4 described below. Similarly, the relationship between θ and the film thickness of the SiN protective film, and the phase of the higher-order mode is expressed by Equation 5 described below. Note that in Equation 4 and Equation 5, the film thickness of the SiN protective film is simply referred to as SiN protective film.

Rayleigh wave=(−51.52545)+1.78434436363636×(θ−127.5)+551.57103030303×(("SiN protective film [λ]")−0.0275)+0.102490363636364×((θ−127.5)×(θ−127.5)−206.25)+60.3989730027549×((θ−127.5)×(("SiN protective film [λ]")−0.0275))     Equation 4

Higher-order mode=(−26.58444)+2.61766496969697×(θ−127.5)+1545.84533333333×(("SiN protective film [λ]")−0.0275)+(−0.0379121515151515)×((θ−127.5)×(θ−127.5)−206.25)+56.9468179981635×((θ−127.5)×(("SiN protective film [λ]")−0.0275))     Equation 5

In the present preferred embodiment, θ in the Euler angles of the piezoelectric layer and the film thickness of the SiN protective film are an angle and a film thickness within a range in which the phase of the Rayleigh wave derived by Equation 4 is equal to or less than about −70° and the phase of the higher-order mode derived by Equation 5 is equal to or less than about −70°. This makes it possible to effectively reduce or prevent not only the higher-order mode but also the Rayleigh wave.

The lower limit of the phase of the Rayleigh wave derived by Equation 4 is preferably about −90°, for example. This makes it possible to more reliably and effectively reduce or prevent the Rayleigh wave. The lower limit of the phase of the higher-order mode derived by Equation 5 is preferably about −90°, for example. This makes it possible to more reliably and effectively reduce or prevent the higher-order mode. The same applies to Equation 6 and Equation 8, and Equation 7 and Equation 9 described later.

Here, the protective film is not limited to the SiN protective film. For example, even in the case where the material of the protective film is aluminum oxide or aluminum nitride, the Rayleigh wave can be effectively reduced or prevented in addition to the higher-order mode. These will be described hereinafter as a first modification and a second modification of the fifth preferred embodiment. In the first modification, the protective film is, for example, an $Al_2O_3$ protective film made of $Al_2O_3$. In the second modification, the protective film is, for example, an AlN protective film made of AlN. Note that the rate of oxygen or nitrogen in aluminum oxide or aluminum nitride of the protective film is not limited to the above.

The relationship between θ in the Euler angles of the piezoelectric layer and the film thickness of the $Al_2O_3$ protective film, and the phase of the Rayleigh wave and the higher-order mode were obtained. Note that the conditions of the acoustic wave device are the same or substantially the same as the conditions for obtaining the relationship in FIG. 26, except that the material of the protective film is $Al_2O_3$.

Protective film: material: $Al_2O_3$, film thickness: about 0.005λ, or more and about 0.05λ, or less FIG. 27 is a diagram shown the relationship between θ in the Euler angles of the piezoelectric layer and the film thickness of the $Al_2O_3$ protective film, and the phase of the Rayleigh wave and the higher-order mode.

Figure 27:
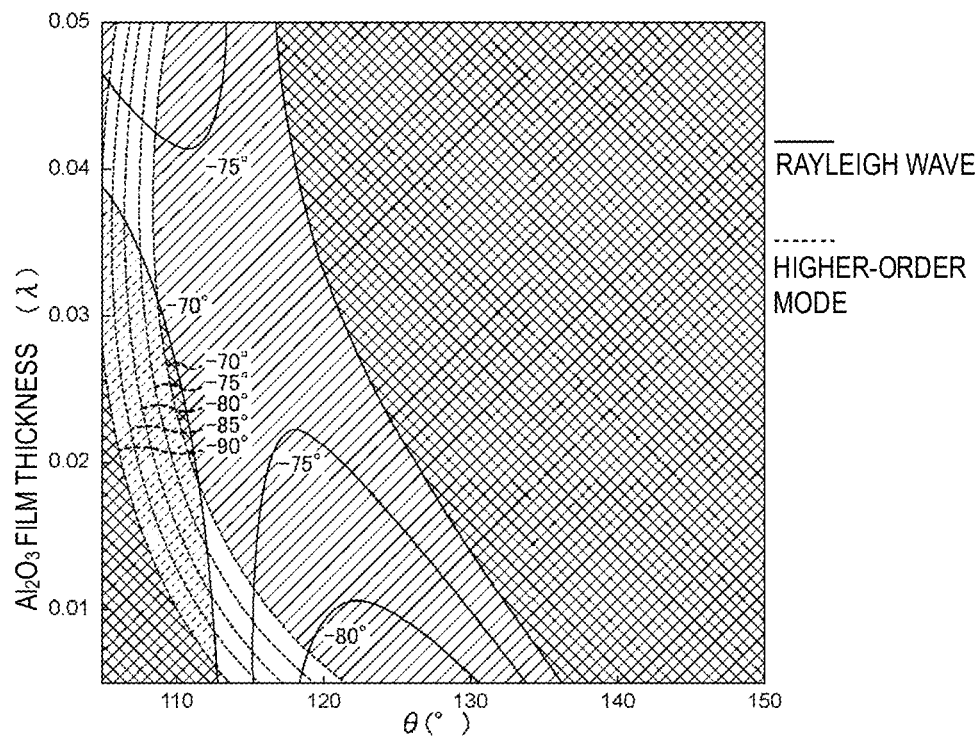
FIG. 27 is a diagram showing the relationship between θ in the Euler angles of the piezoelectric layer and a film thickness of an $Al_2O_3$ protective film, and the phase of the Rayleigh wave and the higher-order mode.

The range other than the hatched range shown in FIG. 27 is a range in which the phase of the higher-order mode is equal to or less than about −70° and the phase of the Rayleigh wave is equal to or less than about −70°. Here, the relationship between θ in the Euler angles of the piezoelectric layer and the film thickness of the $Al_2O_3$ protective film, and the phase of the Rayleigh wave shown in FIG. 27 is expressed Equation 6 described below. Similarly, the relationship between θ and the film thickness of the $Al_2O_3$ protective film, and the phase of the higher-order mode is expressed by Equation 7 described below. Note that in Equation 6 and Equation 7, the film thickness of the $Al_2O_3$ protective film is simply referred to as $Al_2O_3$ protective film.

Rayleigh wave=(−40.9578496399338)+2.25601530917004×(θ−127.272727272727)+964.821146439353×(("Al2O3 protective film [λ]")−0.0274747474747475)+0.100000607678288×((θ−127.272727272727)×(θ−127.272727272727)−203.168044077135)+74.7099873794682×((θ−127.272727272727)×(("Al2O3 protective film [λ]")−0.0274747474747475))     Equation 6

Higher-order mode=(−21.0375184962657)+2.73177575694271×(θ−127.272727272727)+1701.65880601573×(("Al2O3 protective film [λ]")−0.0274747474747475)+(−0.0499273041403373)×(θ−127.272727272727)×(θ−127.272727272727)−203.168044077135)+53.1637721066764×((θ−127.272727272727)×(("Al2O3 protective film [λ]")−0.0274747474747475)+(−34811.3628963409)×((("Al2O3 protective film [λ]")−0.0274747474747475)×(("Al2O3 protective film [λ]")−0.0274747474747475)−0.00020826956433017)     Equation 7

In the first modification, θ in the Euler angles of the piezoelectric layer and the film thickness of the $Al_2O_3$ protective film are an angle and a film thickness within a range in which the phase of the Rayleigh wave derived by Equation 6 is equal to or less than about −70° and the phase of the higher-order mode derived by Equation 7 is equal to or less than about −70°. This makes it possible to effectively reduce or prevent not only the higher-order mode but also the Rayleigh wave.

On the other hand, the relationship between θ in the Euler angle of the piezoelectric layer and the film thickness of the AlN protective film, and the phase of the Rayleigh wave and the higher-order mode was obtained. Note that the conditions of the acoustic wave device are the same as the conditions for obtaining the relationship in FIG. 26, except that the material of the protective film is AlN.

Protective film: material: AlN, film thickness: about 0.005λ or more and about 0.05λ or less FIG. 28 is a diagram showing the relationship between θ in the Euler angles of the piezoelectric layer and the film thickness of the AlN protective film, and the phase of the Rayleigh wave and the higher-order mode.

Figure 28:
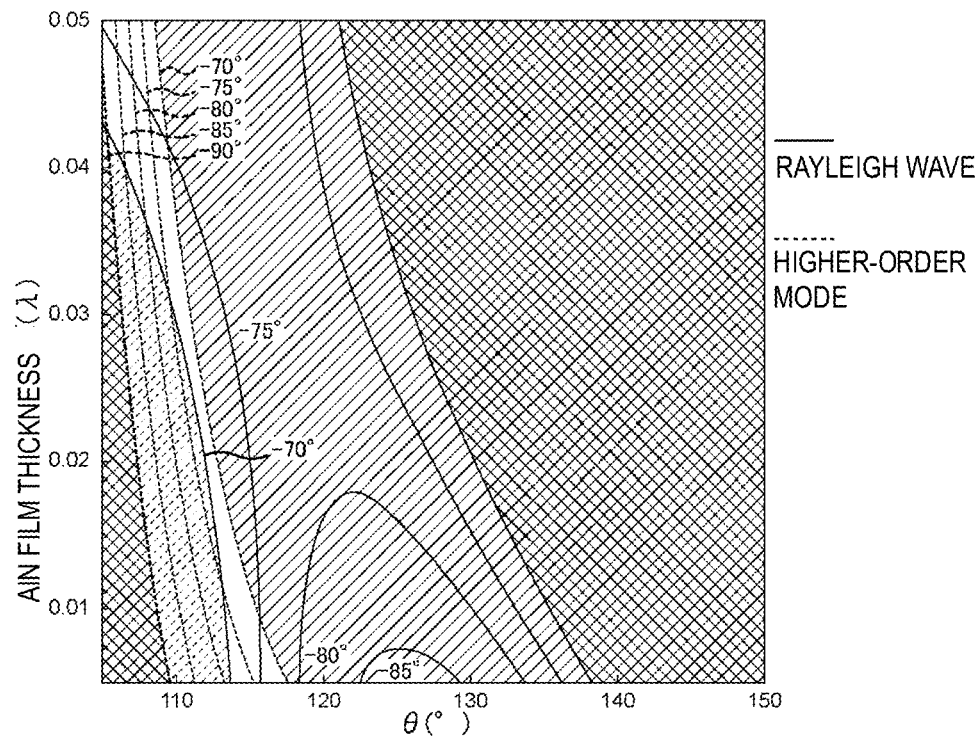
FIG. 28 is a diagram showing the relationship between θ in the Euler angles of the piezoelectric layer and a film thickness of an AlN protective film, and the phase of the Rayleigh wave and the higher-order mode.

The range other than the hatched range shown in FIG. 28 is a range in which the phase of the Rayleigh wave is equal to or less than about −70°. Here, the relationship between θ in the Euler angles of the piezoelectric layer and the film thickness of the AlN protective film, and the phase of the Rayleigh wave shown in FIG. 28 are expressed by Equation 8 described below. Similarly, the relationship between θ and the film thickness of the AlN protective film, and the phase of the higher-order mode are expressed by Equation 9 described below. Note that in Equation 8 and Equation 9, the film thickness of the AlN protective film is simply referred to as AlN protective film.

Rayleigh wave=(−46.4003800000001)+
1.94268775757576×(θ−127.5)+
755.618424242424×(("AlN protective film
[λ]")−0.0275)+0.109821151515152×((θ−127.5)×
(θ−127.5)−206.25)+69.3031610651975×((θ−
127.5)×(("AlN protective film [λ]")−0.0275))   Equation 8

Higher-order mode=(−24.10841)+
2.65936036363636×(θ−127.5)+
1560.34145454545×(("AlN protective film
[λ]")−0.0275)+(−0.0415194696969697)×((θ−
127.5)×(θ−127.5)−206.25)+54.3834578512397×
((θ−127.5)×(("AlN protective film [λ]")−
0.0275))   Equation 9

In the second modification, θ in the Euler angles of the piezoelectric layer and the film thickness of the AlN protective film are an angle and a film thickness within a range in which the phase of the Rayleigh wave derived by Equation 8 is equal to or less than about −70° and the phase of the higher-order mode derived by Equation 9 is equal to or less than about −70°. This makes it possible to effectively reduce or prevent not only the higher-order mode but also the Rayleigh wave.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a silicon support substrate;
a silicon nitride film on the support substrate;
a silicon oxide film on the silicon nitride film;
a piezoelectric layer on the silicon oxide film and made of Y-cut X-SAW propagation lithium tantalate; and
an IDT electrode directly or indirectly on the piezoelectric layer and including a plurality of electrode fingers;
wherein
when a wavelength defined by an electrode finger pitch of the IDT electrode is λ, a film thickness of the piezoelectric layer is equal to or less than about 1λ;
Euler angles of the piezoelectric layer are (about 0±5°, θ, about 0±5°) or (about 0±5°, θ, about 180±5°), and θ in the Euler angles of the piezoelectric layer is about 95.5°≤θ<117.5° or about −84.5°≤θ<−62.5°; and
a relationship between θ in the Euler angles of the piezoelectric layer and a film thickness of the silicon nitride film is a combination shown in Table 1 or Table 2 below:

TABLE 1

| | FILM THICKNESS OF SiN FILM | |
|---|---|---|
| θ | LOWER LIMIT [λ] | UPPER LIMIT [λ] |
| 95.5 ≤ θ < 96.5 | 0.0005 | 0.746 |
| 96.5 ≤ θ < 97.5 | 0.0005 | 0.732 |
| 97.5 ≤ θ < 98.5 | 0.0005 | 0.736 |
| 98.5 ≤ θ < 99.5 | 0.0005 | 0.726 |
| 99.5 ≤ θ < 100.5 | 0.0005 | 0.724 |
| 100.5 ≤ θ < 101.5 | 0.0005 | 0.718 |
| 101.5 ≤ θ < 102.5 | 0.0005 | 0.712 |
| 102.5 ≤ θ < 103.5 | 0.0005 | 0.71 |
| 103.5 ≤ θ < 104.5 | 0.0005 | 0.704 |
| 104.5 ≤ θ < 105.5 | 0.0005 | 0.702 |
| 105.5 ≤ θ < 106.5 | 0.0005 | 0.698 |
| 106.5 ≤ θ < 107.5 | 0.0005 | 0.695 |
| 107.5 ≤ θ < 108.5 | 0.0005 | 0.695 |
| 108.5 ≤ θ < 109.5 | 0.0005 | 0.692 |
| 109.5 ≤ θ < 110.5 | 0.0005 | 0.689 |
| 110.5 ≤ θ < 111.5 | 0.0005 | 0.689 |
| 111.5 ≤ θ < 112.5 | 0.0005 | 0.69 |
| 112.5 ≤ θ < 113.5 | 0.0005 | 0.686 |
| 113.5 ≤ θ < 114.5 | 0.0005 | 0.684 |
| 114.5 ≤ θ < 115.5 | 0.0005 | 0.684 |
| 115.5 ≤ θ < 116.5 | 0.0005 | 0.682 |
| 116.5 ≤ θ < 117.5 | 0.0005 | 0.666; | and

TABLE 2

| | FILM THICKNESS OF SiN FILM | |
|---|---|---|
| θ | LOWER LIMIT [λ] | UPPER LIMIT [λ] |
| −84.5 ≤ θ < −83.5 | 0.0005 | 0.746 |
| −83.5 ≤ θ < −82.5 | 0.0005 | 0.732 |
| −82.5 ≤ θ < −81.5 | 0.0005 | 0.736 |
| −81.5 ≤ θ < −80.5 | 0.0005 | 0.726 |
| −80.5 ≤ θ < −79.5 | 0.0005 | 0.724 |
| −79.5 ≤ θ < −78.5 | 0.0005 | 0.718 |
| −78.5 ≤ θ < −77.5 | 0.0005 | 0.712 |
| −77.5 ≤ θ < −76.5 | 0.0005 | 0.71 |
| −76.5 ≤ θ < −75.5 | 0.0005 | 0.704 |
| −75.5 ≤ θ < −74.5 | 0.0005 | 0.702 |
| −74.5 ≤ θ < −73.5 | 0.0005 | 0.698 |
| −73.5 ≤ θ < −72.5 | 0.0005 | 0.695 |
| −72.5 ≤ θ < −71.5 | 0.0005 | 0.695 |
| −71.5 ≤ θ < −70.5 | 0.0005 | 0.692 |
| −70.5 ≤ θ < −69.5 | 0.0005 | 0.689 |
| −69.5 ≤ θ < −68.5 | 0.0005 | 0.689 |
| −68.5 ≤ θ < −67.5 | 0.0005 | 0.69 |
| −67.5 ≤ θ < −66.5 | 0.0005 | 0.686 |
| −66.5 ≤ θ < −65.5 | 0.0005 | 0.684 |
| −65.5 ≤ θ < −64.5 | 0.0005 | 0.684 |
| −64.5 ≤ θ < −63.5 | 0.0005 | 0.682 |
| −63.5 ≤ θ < −62.5 | 0.0005 | 0.666. |

2. The acoustic wave device according to claim 1 wherein
the film thickness of the silicon nitride film is equal to or less than about 0.5λ;
a plane orientation of the support substrate is Si (111), a propagation angle of the support substrate is Ψ, and n represents any integer (0, ±1, ±2, . . . );
when the Euler angles of the piezoelectric layer are about (0±5°, θ, about 0±5°), a propagation angle Ψ of the support substrate is within a range of about 60°±50°+ 120°×n; and
when the Euler angles of the piezoelectric layer are about 0±5°, θ, about 180±5°), the propagation angle Ψ of the support substrate is within a range of about 0°±50°+ 120°×n.

3. The acoustic wave device according to claim 2, wherein
when the Euler angles of the piezoelectric layer are (about 0±5°, θ, about 0±5°), the propagation angle Ψ of the support substrate is within a range of about 60°±34°+120°×n; and
when the Euler angles of the piezoelectric layer are within a range of (about 0±5°, θ, about 180±5°), the propagation angle Ψ of the support substrate is within a range of about 0°±34°+120°×n.

4. The acoustic wave device according to claim 1, wherein
a dielectric layer is between the piezoelectric layer and the IDT electrode; and
an acoustic velocity of a bulk wave propagating through the dielectric layer is higher than an acoustic velocity of an acoustic wave propagating through the piezoelectric layer.

5. The acoustic wave device according to claim 4, wherein
the dielectric layer is a SiN layer; and
θ in the Euler angles of the piezoelectric layer and a film thickness of the SiN layer are an angle and a film thickness within a range in which a phase of a Rayleigh wave derived by Equation 1 below is equal to or less than about −70°:

Phase of Rayleigh wave=(−81.6949045454545)+(−0.67490613636364)×(θ−110)+(−189.247997265892)×(("SiN film thickness [λ]")−0.05)+0.111730638111889×((θ−110)×(θ−110)−40)+36.1595358851675×((θ−110)×(("SiN film thickness [λ]")−0.05))+5258.22469396632×((("SiN film thickness [λ]")−0.05)×(("SiN film thickness [λ]")−0.05)−0.00083125)   Equation 1.

6. The acoustic wave device according to claim 4, wherein
the dielectric layer is an $Al_2O_3$ layer; and
θ in the Euler angles of the piezoelectric layer and a film thickness of the $Al_2O_3$ layer are an angle and a film thickness within a range in which a phase of a Rayleigh wave derived by Equation 2 below is equal to or less than about −70°:

Phase of Rayleigh wave=(−80.1333863636364)+(−0.554522499999998)×(θ−110)+(−173.463554340396)×(("Al2O3 film thickness [λ]")−0.05)+0.149698033216783×((θ−110)×(θ−110)−40)+41.1703301435407×((θ−110)*(("Al2O3 film thickness [λ]")−0.05))+4990.83763126825×((("Al2O3 film thickness [λ]")−0.05)×(("Al2O3 film thickness [λ]")−0.05)−0.00083125)   Equation 2.

7. The acoustic wave device according to claim 4, wherein
the dielectric layer is an AlN layer; and
θ in the Euler angles of the piezoelectric layer and a film thickness of the AlN layer are an angle and a film thickness within a range in which a phase of a Rayleigh wave derived by Equation 3 below is equal to or less than about −70°:

Phase of Rayleigh wave=(−87.3504136363636)+(−0.270137500000004)×(θ−110)+(−97.7367464114832)×(("AlN film thickness [λ]")−0.05)+0.0257423222610727×((θ−110)×(θ−110)−40)+14.0575563909775×((θ−110)×(("AlN β [λ]")−0.05))+3335.40856272914×((("AlN film thickness [λ]")−0.05)×(("AlN film thickness [λ]")−0.05)−0.00083125)   Equation 3.

8. The acoustic wave device according to claim 1, further comprising:
a protective film on the piezoelectric layer so as to cover the IDT electrode; wherein
the protective film is a SiN protective film made of SiN; and
θ in the Euler angles of the piezoelectric layer and a film thickness of the SiN protective film are an angle and a film thickness within a range in which a phase of a Rayleigh wave derived by Equation 4 below is equal to or less than about −70° and a phase of a higher-order mode derived by Equation 5 below is equal to or less than about −70°:

Rayleigh wave=(−51.52545)+1.78434436363636×(θ−127.5)+551.57103030303×(("SiN protective film [λ]")−0.0275)+0.102490363636364×((θ−127.5)×(θ−127.5)−206.25)+60.3989730027549×((θ−127.5)×(("SiN protective film [λ]")−0.0275))   Equation 4; and Higher-order mode=(−26.58444)+2.61766496969697×(θ−127.5)+1545.84533333333×(("SiN protective film [λ]")−0.0275)+(−0.0379121515151515)×((θ−127.5)×(θ−127.5)−206.25)+56.9468179981635×((θ−127.5)×(("SiN protective film [λ]")−0.0275))   Equation 5.

9. The acoustic wave device according to claim 1, further comprising:
a protective film on the piezoelectric layer so as to cover the IDT electrode; wherein
the protective film is an $Al_2O_3$ protective film made of $Al_2O_3$; and
θ in the Euler angles of the piezoelectric layer and a film thickness of the $Al_2O_3$ protective film are an angle and a film thickness within a range in which a phase of a Rayleigh wave derived by Equation 6 below is equal to or less than about −70° and a phase of a higher-order mode derived by Equation 7 below is equal to or less than about −70°:

Rayleigh wave=(−40.9578496399338)+2.25601530917004×(θ−127.272727272727)+964.821146439353×(("Al2O3 protective film [λ]")−0.0274747474747475)+0.100000607678288×((θ−127.272727272727)×(θ−127.272727272727)−203.168044077135)+74.7099873794682×((θ−127.272727272727)×(("Al2O3 protective film [λ]")−0.0274747474747475))   Equation 6; and Higher-order mode=(−21.0375184962657)+2.73177575694271×(θ−127.272727272727)+1701.65880601573×(("Al2O3 protective film [λ]")−0.0274747474747475)+(−0.0499273041403373)×((θ−127.272727272727)×(θ−127.272727272727)−203.168044077135)+53.1637721066764×((θ−127.272727272727)×(("Al2O3 protective film [λ]")−0.0274747474747475))+(−34811.3628963409)×((("Al2O3 protective film [λ]")−0.0274747474747475)×(("Al2O3 protective film [λ]")−0.0274747474747475)−0.00020826956433017)   Equation 7.

10. The acoustic wave device according to claim 1, further comprising:
a protective film on the piezoelectric layer so as to cover the IDT electrode; wherein
the protective film is an AlN protective film made of AlN; and
θ in the Euler angles of the piezoelectric layer and a film thickness of the AlN protective film are an angle and a film thickness within a range in which a phase of a Rayleigh wave derived by Equation 8 below is equal to or less than about −70° and a phase of a higher-order mode derived by Equation 9 below is equal to or less than about −70°:

Rayleigh wave=(−46.4003800000001)+
1.94268775757576×(θ−127.5)+
755.618424242424×(("AlN protective film
[λ]")−0.0275)+0.109821151515152×((θ−127.5)×
(θ−127.5)−206.25)+69.3031610651975×((θ−
127.5)×(("AlN protective film [λ]")−0.0275))  Equation 8; and Higher-order mode=(−24.10841)+
2.65936036363636×(θ−127.5)+
1560.34145454545×(("AlN protective film
[λ]")−0.0275)+(−0.0415194696969697)×((θ−
127.5)×(θ−127.5)−206.25)+54.3834578512397×
((θ−127.5)×(("AlN protective film [λ]")−
0.0275))  Equation 9.

11. An acoustic wave device comprising:
a silicon support substrate;
a silicon nitride film on the support substrate;
a silicon oxide film on the silicon nitride film;
a piezoelectric layer on the silicon oxide film and using Y-cut X-SAW propagation lithium tantalate; and
an IDT electrode on the piezoelectric layer and including a plurality of electrode fingers; wherein
when a wavelength defined by an electrode finger pitch of the IDT electrode is λ, a film thickness of the piezoelectric layer is equal to or less than about 1λ;
Euler angles of the piezoelectric layer are (about 0±5°, θ, about 0±5°), and θ in the Euler angles of the piezoelectric layer is about 117.5°≤θ<129.5°; and
a relationship between θ in the Euler angles of the piezoelectric layer and a film thickness of the silicon nitride film is a combination shown in Table 3 below:

TABLE 3

| θ | FILM THICKNESS OF SiN FILM | |
|---|---|---|
| | LOWER LIMIT [λ] | UPPER LIMIT [λ] |
| 117.5 ≤ θ < 118.5 | 0.0005 | 0.092 |
| 117.5 ≤ θ < 118.5 | 0.166 | 0.597 |
| 118.5 ≤ θ < 119.5 | 0.0005 | 0.07 |
| 118.5 ≤ θ < 119.5 | 0.168 | 0.554 |
| 119.5 ≤ θ < 120.5 | 0.005 | 0.063 |
| 119.5 ≤ θ < 120.5 | 0.152 | 0.522 |
| 120.5 ≤ θ < 121.5 | 0.004 | 0.06 |
| 120.5 ≤ θ < 121.5 | 0.132 | 0.492 |
| 121.5 ≤ θ < 122.5 | 0.022 | 0.052 |
| 121.5 ≤ θ < 122.5 | 0.12 | 0.466 |
| 122.5 ≤ θ < 123.5 | 0.22 | 0.43 |
| 123.5 ≤ θ < 124.5 | 0.24 | 0.4 |
| 124.5 ≤ θ < 125.5 | 0.25 | 0.38 |
| 125.5 ≤ θ < 126.5 | 0.25 | 0.38 |
| 126.5 ≤ θ < 127.5 | 0.25 | 0.36 |

TABLE 3-continued

| θ | FILM THICKNESS OF SiN FILM | |
|---|---|---|
| | LOWER LIMIT [λ] | UPPER LIMIT [λ] |
| 127.5 ≤ θ < 128.5 | 0.25 | 0.31 |
| 128.5 ≤ θ < 129.5 | 0.25 | 0.28. |

12. An acoustic wave device comprising:
a silicon support substrate;
a silicon nitride film on the support substrate;
a silicon oxide film on the silicon nitride film;
a piezoelectric layer on the silicon oxide film and using Y-cut X-SAW propagation lithium tantalate; and
an IDT electrode on the piezoelectric layer and including a plurality of electrode fingers; wherein
when a wavelength defined by an electrode finger pitch of the IDT electrode is λ, a film thickness of the piezoelectric layer is equal to or less than about 1λ;
Euler angles of the piezoelectric layer are (about 0±5°, θ, about 0±5°), and θ in the Euler angles of the piezoelectric layer is about 85.5°≤θ<95.5°; and
a relationship between θ in the Euler angles of the piezoelectric layer and a film thickness of the silicon nitride film is a combination shown in Table 4 below:

TABLE 4

| θ | FILM THICKNESS OF SiN FILM | |
|---|---|---|
| | LOWER LIMIT [λ] | UPPER LIMIT [λ] |
| 85.5 ≤ θ < 86.5 | 0.0005 | 0.03 |
| 85.5 ≤ θ < 86.5 | 0.43 | 0.46 |
| 86.5 ≤ θ < 87.5 | 0.0005 | 0.038 |
| 86.5 ≤ θ < 87.5 | 0.42 | 0.47 |
| 87.5 ≤ θ < 88.5 | 0.0005 | 0.048 |
| 87.5 ≤ θ < 88.5 | 0.412 | 0.485 |
| 88.5 ≤ θ < 89.5 | 0.0005 | 0.058 |
| 88.5 ≤ θ < 89.5 | 0.404 | 0.506 |
| 89.5 ≤ θ < 90.5 | 0.0005 | 0.07 |
| 89.5 ≤ θ < 90.5 | 0.388 | 0.52 |
| 90.5 ≤ θ < 91.5 | 0.0005 | 0.085 |
| 90.5 ≤ θ < 91.5 | 0.37 | 0.538 |
| 91.5 ≤ θ < 92.5 | 0.0005 | 0.102 |
| 91.5 ≤ θ < 92.5 | 0.346 | 0.56 |
| 92.5 ≤ θ < 93.5 | 0.0005 | 0.128 |
| 92.5 ≤ θ < 93.5 | 0.315 | 0.59 |
| 93.5 ≤ θ < 94.5 | 0.0005 | 0.166 |
| 93.5 ≤ θ < 94.5 | 0.295 | 0.616 |
| 94.5 ≤ θ < 95.5 | 0.0005 | 0.226 |
| 94.5 ≤ θ < 95.5 | 0.284 | 0.66. |

\* \* \* \* \*